(12) United States Patent  (10) Patent No.: US 7,710,736 B2
Middlekauff et al.  (45) Date of Patent: May 4, 2010

(54) MEMORY CARD WITH LATCHING MECHANISM FOR HINGED COVER

(75) Inventors: Warren Middlekauff, San Jose, CA (US); Robert C. Miller, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 881 days.

(21) Appl. No.: 11/462,430

(22) Filed: Aug. 4, 2006

(65) Prior Publication Data
US 2008/0030963 A1  Feb. 7, 2008

Related U.S. Application Data

(63) Continuation-in-part of application No. 11/196,160, filed on Aug. 2, 2005, now Pat. No. 7,310,692.

(51) Int. Cl.
H05K 5/03 (2006.01)
(52) U.S. Cl. .................. 361/737; 361/755; 439/638; 439/76.1; 235/492; 257/679
(58) Field of Classification Search .................. 361/737, 361/759, 747; 235/492; 439/76.1, 638; 257/679
See application file for complete search history.

(56) References Cited

U.S. PATENT DOCUMENTS

| | | |
|---|---|---|
| 4,555,619 A | 11/1985 | Anderson |
| 4,885,430 A | 12/1989 | Kinser, Jr. et al. |
| 5,155,663 A | 10/1992 | Harase |
| 5,457,601 A | 10/1995 | Georgopulos et al. |
| 5,486,687 A | 1/1996 | Le Roux |
| 5,603,629 A | 2/1997 | DeFrasne et al. |
| 5,752,857 A | 5/1998 | Knights |
| 5,815,426 A | 9/1998 | Jigour et al. |

(Continued)

FOREIGN PATENT DOCUMENTS

DE  202 07 720 U1  9/2002

(Continued)

OTHER PUBLICATIONS

Flash Memory, SanDisk by Chetz on Dec. 20, 2006, www.slipperybrick.com/2006/12/sandisk-ultra-ii-sd-card-with-usb, p. 3.

(Continued)

*Primary Examiner*—Dameon E Levi
(74) *Attorney, Agent, or Firm*—Davis Wright Tremaine LLP

(57) ABSTRACT

An enclosed re-programmable non-volatile memory card includes a cover that is hinged to the card to normally cover a set of external contacts to which the memory is connected but which can be rotated out of the way by hand to expose that set of contacts for connection with a mating receptacle of a host device. A second set of electrical contacts having a different pattern than the covered set may also be provided on the card. The covered set of contacts may be in accordance with the universal serial bus (USB) plug standards. A latching mechanism built into the hinged cover holds it firmly in a closed position but allows its manual release to expose the covered set of contacts. One exemplary release mechanism utilizes a resiliently held element that is moveable by hand against the resilience, and another employs a hand slideable latch.

25 Claims, 12 Drawing Sheets

U.S. PATENT DOCUMENTS

| | | | |
|---|---|---|---|
| 5,887,145 | A | 3/1999 | Harari et al. |
| 5,933,328 | A * | 8/1999 | Wallace et al. ............... 361/737 |
| 5,964,595 | A | 10/1999 | Centofante |
| 5,969,333 | A | 10/1999 | Barthelemy et al. |
| 5,984,708 | A | 11/1999 | Yu |
| 5,986,891 | A | 11/1999 | Sugimoto |
| 5,987,704 | A | 11/1999 | Tang |
| 6,040,622 | A | 3/2000 | Wallace |
| 6,069,795 | A | 5/2000 | Klatt et al. |
| 6,097,605 | A | 8/2000 | Klatt et al. |
| 6,121,681 | A | 9/2000 | Tanaka et al. |
| 6,137,710 | A | 10/2000 | Iwasaki et al. |
| 6,151,652 | A | 11/2000 | Kondo et al. |
| 6,154,359 | A | 11/2000 | Kamikakai et al. |
| 6,176,721 | B1 | 1/2001 | Gottardo et al. |
| 6,181,564 | B1 | 1/2001 | Furusho |
| 6,234,810 | B1 | 5/2001 | Schnell et al. |
| 6,243,686 | B1 | 6/2001 | McPherson et al. |
| D444,473 | S | 7/2001 | Okamoto et al. |
| D445,111 | S | 7/2001 | Okamoto et al. |
| 6,256,692 | B1 | 7/2001 | Yoda et al. |
| 6,266,724 | B1 | 7/2001 | Harari et al. |
| D446,525 | S | 8/2001 | Okamoto et al. |
| 6,279,114 | B1 | 8/2001 | Toombs et al. |
| 6,295,206 | B1 | 9/2001 | Kondo et al. |
| 6,312,268 | B1 | 11/2001 | Chih-Kai |
| 6,325,291 | B1 | 12/2001 | Eisele et al. |
| 6,330,151 | B1 | 12/2001 | Bates, III |
| 6,341,728 | B1 | 1/2002 | Kondo et al. |
| 6,343,945 | B1 * | 2/2002 | Liikanen ..................... 439/160 |
| 6,353,870 | B1 | 3/2002 | Mills et al. |
| 6,381,143 | B1 | 4/2002 | Nakamura |
| 6,385,677 | B1 | 5/2002 | Yao et al. |
| 6,422,469 | B1 | 7/2002 | Pernet |
| 6,435,409 | B1 | 8/2002 | Hu |
| 6,438,638 | B1 | 8/2002 | Jones et al. |
| 6,439,464 | B1 | 8/2002 | Fruhauf et al. |
| 6,483,038 | B2 | 11/2002 | Lee et al. |
| 6,518,927 | B2 | 2/2003 | Schremmer et al. |
| 6,524,137 | B1 | 2/2003 | Liu et al. |
| 6,561,421 | B1 | 5/2003 | Yu |
| 6,567,273 | B1 | 5/2003 | Liu et al. |
| 6,580,615 | B1 | 6/2003 | Nakanishi et al. |
| 6,590,615 | B2 | 7/2003 | Murakami et al. |
| 6,594,154 | B1 | 7/2003 | Brewer et al. |
| 6,612,498 | B1 | 9/2003 | Lipponen et al. |
| 6,612,853 | B2 | 9/2003 | Wu |
| 6,617,673 | B2 | 9/2003 | Lee et al. |
| 6,623,304 | B2 | 9/2003 | Harasawa et al. |
| 6,632,097 | B2 | 10/2003 | Chang |
| 6,646,885 | B1 | 11/2003 | Yu et al. |
| 6,669,487 | B1 | 12/2003 | Nishizawa et al. |
| 6,676,420 | B1 | 1/2004 | Liu et al. |
| 6,733,340 | B2 | 5/2004 | Nishio et al. |
| 6,738,259 | B2 | 5/2004 | Le et al. |
| 6,743,030 | B2 | 6/2004 | Lin et al. |
| 6,757,172 | B2 * | 6/2004 | Maruyama ................... 361/737 |
| 6,763,410 | B2 | 7/2004 | Yu |
| 6,820,148 | B1 | 11/2004 | Cedar et al. |
| 6,883,718 | B1 | 4/2005 | Le et al. |
| 6,888,724 | B2 * | 5/2005 | Shaie ......................... 361/719 |
| 6,890,188 | B1 | 5/2005 | Le |
| 6,901,457 | B1 | 5/2005 | Toombs et al. |
| 6,908,038 | B1 * | 6/2005 | Le ............................ 235/492 |
| 6,926,546 | B2 | 8/2005 | Kurokawa |
| 6,944,028 | B1 | 9/2005 | Yu et al. |
| 6,979,210 | B2 | 12/2005 | Regen et al. |
| 7,004,780 | B1 | 2/2006 | Wang |
| 7,062,585 | B2 | 6/2006 | Chen |
| 7,092,256 | B1 | 8/2006 | Salazar et al. |
| 7,104,809 | B1 * | 9/2006 | Huang ........................ 439/76.1 |
| 7,152,801 | B2 | 12/2006 | Cuellar et al. |
| D535,297 | S | 1/2007 | Cuellar et al. |
| D542,797 | S * | 5/2007 | Cuellar et al. ............... D14/436 |
| 7,310,692 | B2 * | 12/2007 | Miller et al. .................. 710/11 |
| 7,328,481 | B2 | 2/2008 | Barnett |
| 7,340,540 | B2 * | 3/2008 | Miller et al. .................. 710/11 |
| 7,355,860 | B2 * | 4/2008 | Miller et al. ................. 361/737 |
| 7,364,090 | B2 * | 4/2008 | Cuellar et al. ............... 235/492 |
| 7,364,468 | B2 | 4/2008 | Liu et al. |
| 7,487,265 | B2 * | 2/2009 | Miller et al. .................. 710/11 |
| 7,537,169 | B2 * | 5/2009 | Gonzalez et al. ........... 235/492 |
| 7,554,813 | B2 * | 6/2009 | Miller et al. ................. 361/737 |
| 2001/0009505 | A1 | 7/2001 | Nishizawa et al. |
| 2003/0100203 | A1 | 5/2003 | Yen |
| 2003/0212848 | A1 | 11/2003 | Liu et al. |
| 2003/0233507 | A1 | 12/2003 | Yu et al. |
| 2004/0033726 | A1 | 2/2004 | Kao |
| 2004/0033727 | A1 | 2/2004 | Kao |
| 2004/0039854 | A1 | 2/2004 | Estakhri et al. |
| 2004/0042323 | A1 | 3/2004 | Moshayedi |
| 2004/0089717 | A1 | 5/2004 | Harari et al. |
| 2005/0037647 | A1 | 2/2005 | Le |
| 2005/0037671 | A1 | 2/2005 | Yamada et al. |
| 2005/0042930 | A1 | 2/2005 | Harkabi et al. |
| 2005/0230483 | A1 | 10/2005 | Miller et al. |
| 2005/0230484 | A1 | 10/2005 | Cuellar et al. |
| 2006/0084287 | A1 | 4/2006 | Miller et al. |
| 2006/0112209 | A1 | 5/2006 | Yao |
| 2006/0282553 | A1 | 12/2006 | Miller et al. |
| 2007/0099511 | A1 | 5/2007 | Miller et al. |
| 2008/0064272 | A1 | 3/2008 | Miller et al. |

FOREIGN PATENT DOCUMENTS

| | | |
|---|---|---|
| DE | 20304040U1 A | 3/2003 |
| DE | 20311679 U1 | 11/2003 |
| EP | 0891047 | 1/1999 |
| EP | 1085516 | 3/2001 |
| EP | 1 146 428 A1 | 10/2001 |
| EP | 1 333 531 A1 | 8/2003 |
| GB | 2 430 508 A | 3/2007 |
| JP | 2001-307801 | 11/2001 |
| WO | WO 00/70553 | 11/2000 |
| WO | WO 0184490 | 8/2001 |
| WO | WO 02/13021 A3 | 2/2002 |
| WO | WO 02/15020 | 2/2002 |
| WO | WO 02/19266 | 3/2002 |
| WO | WO 2005/086011 A1 | 9/2005 |
| WO | WO 2005/104025 A | 11/2005 |
| WO | WO 2005/106781 A | 11/2005 |

OTHER PUBLICATIONS

EPO/ISA, "Notification of Transmittal of the International Search Report and Written Opinion of the International Searching Authority, or the Declaration," corresponding International Application No. PCT/US2007/074858 on Apr. 17, 2008, 13 pages.

Micro Center On-Line, "A-Data 2 GB Micro Secure Digital Trio," http://microcenter.com/single_product_results.phtml?product_id=0273833 Printed from Internet on Oct. 3, 2008, 1 page.

"Identification Cards—Integrated Circuit(s) Cards With Contact, Part 1: Physical Characteristics, Amendment 1: Maximum Height of the IC Contact Surface", ISO/IEC 7816-1, Nov. 15, 2003, 7 pages.

"Identification cards—Physical characteristics", International Organization for Standardization (ISO) and the International Electrotechnical Commission (IEC), ISO/IEC 7810 standard, second edition, Aug. 15, 1995. 9 pages.

"IEEE Standard for a High Performance Serial Bus", document No. IEEE 1394 -1995, pp. 1-81, 259-260, 336-341, as amended by document Nos. IEEE 1394a—2000 pp. 1-2 and 24, and IEEE 1394b—2002, pp. 1-2, 35-75.

"Information Technology—Identification Cards—Integrated Circuit(s) Cards With Contacts, Part 2: Dimensions and Location of the Contacts", ISO/IEC 7816-2, Mar. 1, 1999, 10 pages.

"Information Technology—Identification Cards—Integrated Circuit(s) Cards With Contact, Part 3: Electronic Signals and Transmission Protocols", ISO/IEC 7816-3, 2nd Edition, Dec. 15, 1997, 32 pages.

"Information Technology—Identification Cards—Integrated Circuit(s) Cards With Contact, Part 3: Electronic Signals and Transmission Protocols, Amendment 1: Electrical Characteristics and Class Indication for Integrated Circuit(s) Cards Operating at 5 V, 3 V and 1,8 V", ISO/IEC 7816-3, Jun. 1, 2002, 10 pages.

"PC Card Standard Release 8.0", Personal Computer Memory Card International Association (PCMCIA), Apr. 2001, vol. 1, pp. iii-34 and vol. 3, pp. iii-70.

"SanDisk Cruzer USB Flash Drives", http://www.sandisk.com/pdf/retail/Cruzer_Family_Brochure_English.pdf, Jan. 20, 2004, 2 pages.

"SanDisk Launches Cruzer USB Flash Drives and Cruzer Micro MP3 Companion Player in China, Taiwan and Hong Kong", http://www.sandisk.com/pressrelease/20040407.html, Apr. 9, 2004, 4 pages.

"USB Flash Drive", http://www.pqimemory.com/products-istick.asp, downloaded Sep. 7, 2004, 2 pages.

"What is Memory Stick", http://www.memorystick.org/eng/aboutms/family.html, downloaded Mar. 12, 2004, 4 pages.

CompactFlash Association, "CF+ and CompactFlash Specification," Revision 2.0, May 2003, 137 pages.

Compaq et al., "Universal Serial Bus Specification", revision 2.0, Apr. 27, 2000, pp. i-xxvii, 1-24 and 85-117.

GSM Global System for Mobile Communication, "Digital Cellular Telecommunications System (Phase 2+); Specification of the Subscriber Identity Module—Mobile Equipment (SIM—ME) Interface," GSM 11.11 Version 8.3.0 Release 1999, 170 pages.

Hughes, Judie, "Gadgeteer Hands on Review: Intelligent Stick USB Drive", Nov. 6, 2003, http://pqilst.com/reviews/review020404.asp, 3 pages.

MMCA Technical Committee, "The MultiMediaCard System Specification," Version 3.1, Jun. 2001, 130 pages.

SanDisk Corporation, "CompactFlash Memory Card Product Manual," revision 10.1, Sep. 2003, 97 pages.

SanDisk Corporation, "MultiMediaCard Product Manual," Revision 5.2, Mar. 2003, 100 pages.

SanDisk Corporation, "SanDisk miniSD Card Product Manual", Version 1.0, Apr. 2003, 110 pages.

SanDisk Corporation, SanDisk Standard Grade, CompactFlash and PC Card, Product Manual, Version 1.4, Dec. 2003, 104 pages.

SD Group, "SD Memory Card Simplified Specifications, Part 1, Physical Layer Specification", Version 0.96, Jan. 2000, 28 pages.

SD Group, "Simplified Version of Part 1: Physical Layer Specification", Version 1.01, Apr. 15, 2001, 32 pages.

* cited by examiner

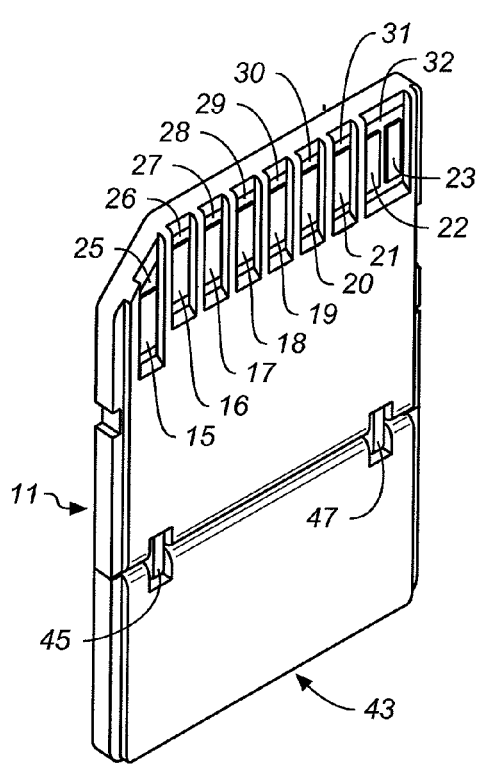
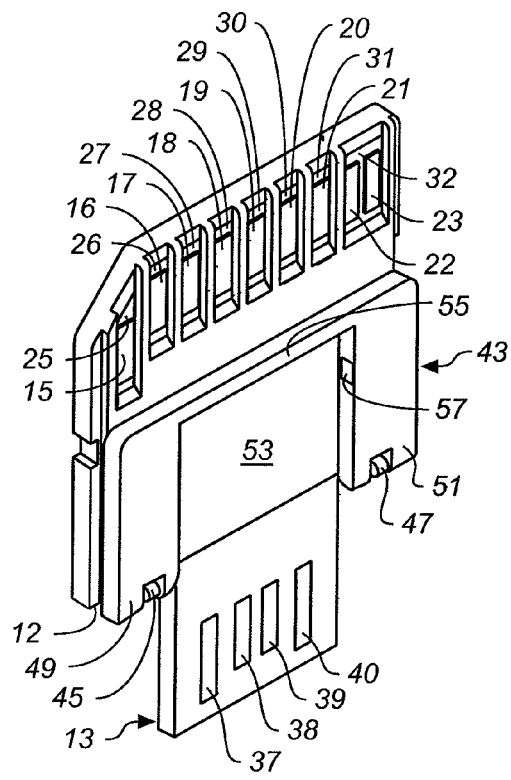
FIG. 1A    FIG. 1B
FIG. 2A    FIG. 2B

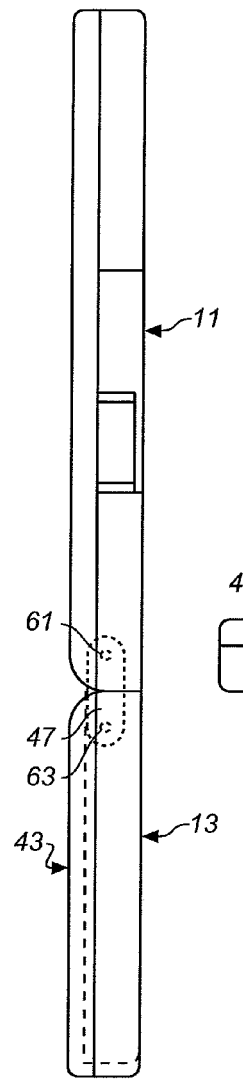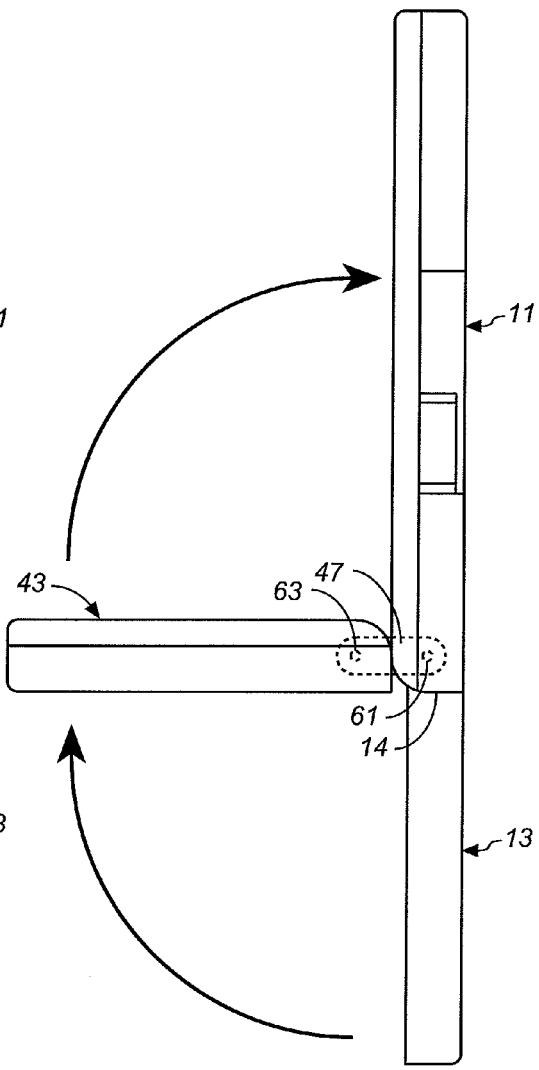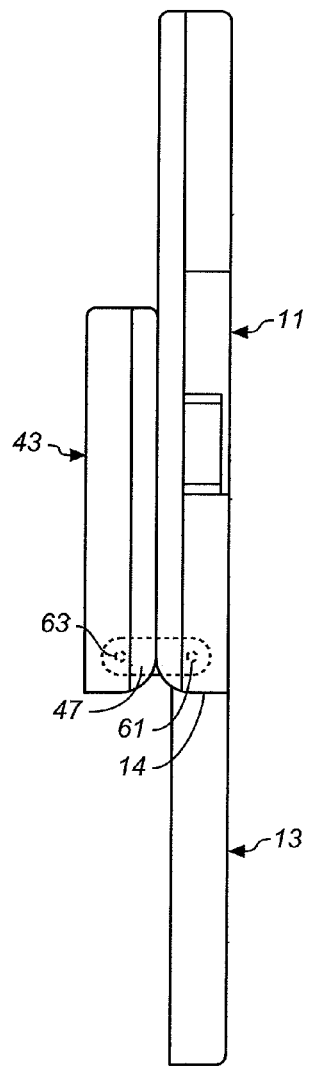
*FIG. 3A*  *FIG. 3B*  *FIG. 3C*

MEMORY CARD WITH LATCHING MECHANISM FOR HINGED COVER

CROSS-REFERENCE TO RELATED APPLICATIONS

This is related to the following three United States utility patent applications: application Ser. No. 10/826,801, filed Apr. 16, 2004 by Cuellar et al., publication no. 2005/0230484A1, application Ser. No. 10/826,796, filed Apr. 16, 2004 by Miller et al., publication no. 2005/0230483A1, and a continuation-in-part thereof, application Ser. No. 11/196,160, filed Aug. 2, 2005 by Miller et al., publication no. 2006/0084287A1.

This is also related to the following two United States design patent applications: application Ser. No. 29/203,693, filed Apr. 16, 2004 by Cuellar et al., and application Ser. No. 29/235,538, filed Aug. 2, 2005 by Cuellar et al.

BACKGROUND AND SUMMARY

This invention relates generally to the use and structure of removable electronic circuit cards, particularly those including mass re-programmable non-volatile integrated circuit memory.

Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls operation of the memory cell array and interfaces with a host to which the card connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard.

One such standard, the PC Card Standard, provides specifications for three types of PC Cards. Originally released in 1990, the PC Card Standard now contemplates three forms of a rectangular card measuring 85.6 mm. by 54.0 mm., having thicknesses of 3.3 mm. (Type I), 5.0 mm. (Type II) and 10.5 mm. (Type III). An electrical connector, which engages pins of a slot in which the card is removably inserted, is provided along a narrow edge of the card. PC Card slots are included in current notebook personal computers, as well as in other host equipment, particularly portable devices. The PC Card Standard is a product of the Personal Computer Memory Card International Association (PCMCIA). The current PC Card specifications, "PC Card Standard Release 8.0," dated April 2001, is available from the PCMCIA.

In 1994, SanDisk Corporation, assignee of the present application, introduced the CompactFlash™ card (CF™ card) that is functionally compatible with the PC Card but is much smaller. The CF™ card is rectangularly shaped with dimensions of 42.8 mm. by 36.4 mm. and a thickness of 3.3 mm., and has a female pin connector along one edge. The CF™ card is widely used with cameras for the storage of still video data. A passive adapter card is available, in which the CF card fits, that then can be inserted into a PC Card slot of a host computer or other device. The controller within the CF card operates with the card's flash memory to provide an ATA interface at its connector. That is, a host with which a CF card is connected interfaces with the card as if it is a disk drive. Specifications for the CompactFlash card have been established by the CompactFlash Association, "CF+ and Compact-Flash Specification Revision 2.0," dated May 2003. An implementation of these specifications is described by SanDisk Corporation in a product manual "CompactFlash Memory Card Product Manual," revision 10.1, dated September 2003.

The SmartMedia™ card is about one-third the size of a PC Card, having dimensions of 45.0 mm. by 37.0 mm. and is very thin at only 0.76 mm. thick. Contacts are provided in a defined pattern as areas on a surface of the card. Its specifications have been defined by the Solid State Floppy Disk Card (SSFDC) Forum, which began in 1996. It contains flash memory, particularly of the NAND type. The SmartMedia™ card is intended for use with portable electronic devices, particularly cameras and audio devices, for storing large amounts of data. A memory controller is included either in the host device or in an adapter card in another format such as one according to the PC Card standard. Physical and electrical specifications for the SmartMedia™ card have been issued by the SSFDC Forum.

Another non-volatile memory card is the MultiMediaCard (MMC™). The physical and electrical specifications for the MMC™ are given in "The MultiMediaCard System Specification" that is updated and published from time-to-time by the MultiMediaCard Association (MMCA), including version 3.1, dated June 2001. MMC products having varying storage capacity are currently available from SanDisk Corporation. The MMC card is rectangularly shaped with a size similar to that of a postage stamp. The card's dimensions are 32.0 mm. by 24.0 mm. and 1.4 mm. thick, with a row of electrical contacts on a surface of the card along a narrow edge that also contains a cut-off corner. These products are described in a "MultiMediaCard Product Manual," Revision 5.2, dated March 2003, published by SanDisk Corporation. Certain aspects of the electrical operation of the MMC products are also described in U.S. Pat. Nos. 6,279,114 and 6,901,457, both by applicants Thomas N. Toombs and Micky Holtzman, and assigned to SanDisk Corporation. The physical card structure and a method of manufacturing it are described in U.S. Pat. No. 6,040,622, assigned to SanDisk Corporation.

A modified version of the MMC™ card is the later Secure Digital (SD) card. The SD Card has the same rectangular size as the MMC™ card but with an increased thickness (2.1 mm.) in order to accommodate an additional memory chip when that is desired. A primary difference between these two cards is the inclusion in the SD card of security features for its use to store proprietary data such as that of music. Another difference between them is that the SD Card includes additional data contacts in order to enable faster data transfer between the card and a host. The other contacts of the SD Card are the same as those of the MMC™ card in order that sockets designed to accept the SD Card can also be made to accept the MMC™ card. A total of nine contacts are positioned along a short edge of the card that contains a cutoff corner. This is described in U.S. Pat. No. 6,820,148. The electrical interface with the SD card is further made to be, for the most part, backward compatible with the MMC™ card, in order that few changes to the operation of the host need be made in order to accommodate both types of cards. Complete specifications for the SD card are available to member companies from the SD Association (SDA). A public document describing the physical and some electrical characteristics of the SD Card is available from the SDA: "Simplified Version of: Part 1 Physical Layer Specification Version 1.01," dated Apr. 15, 2001.

More recently, a miniSD card has been specified by the SDA and is commercially available. This card is smaller than the SD card but provides much of the same functionality. It has a modified rectangular shape with dimensions of 21.5 mm. long, 20.0 mm. wide and 1.4 mm. thick. A total of eleven electrical contacts are positioned in a row on a surface of the card along one edge. The miniSD memory card is available from SanDisk Corporation and described in the "SanDisk miniSD Card Product Manual," version 1.0, April 2003.

Another type of memory card is the Subscriber Identity Module (SIM), the specifications of which are published by the European Telecommunications Standards Institute (ETSI). A portion of these specifications appear as GSM 11.11, a recent version being technical specification ETSI TS 100 977 V8.3.0 (2000-08), entitled "Digital Cellular Telecommunications System (Phase 2+); Specification of the Subscriber Identity Module—Mobile Equipment (SIM-ME) Interface," (GSM 11.11 Version 8.3.0 Release 1999). Two types of SIM cards are specified: ID-1 SIM and Plug-in SIM.

The ID-1 SIM card has a format and layout according to the ISO/IEC 7810 and 7816 standards of the International Organization for Standardization (ISO) and the International Electrotechnical Commission (IEC). The ISO/IEC 7810 standard is entitled "Identification cards—Physical characteristics," second edition, August 1995. The ISO/IEC 7816 standard has the general title of "Identification cards—Integrated Circuit (s) Cards with Contacts," and consists of parts 1-10 that carry individual dates from 1994 through 2000. Copies of these standards are available from the ISO/IEC in Geneva, Switzerland. The ID-1 SIM card is generally the size of a credit card, having dimensions of 85.60 mm. by 53.98 mm., with rounder corners, and a thickness of 0.76 mm. Such a card may have only memory or may also include a microprocessor, the latter often being referred to as a "Smart Card." One application of a Smart Card is as a debit card where an initial credit balance is decreased every time it is used to purchase a product or a service.

The Plug-in SIM is a very small card, smaller than the MMC™ and SD cards. The GSM 11.11 specification referenced above calls for this card to be a rectangle 25 mm. by 15 mm., with one corner cut off for orientation, and with the same thickness as the ID-1 SIM card. A primary use of the Plug-in SIM card is in mobile telephones and other devices for security against the theft and/or unauthorized use of the devices, in which case the card stores a security code personal to the device's owner or user. In both types of SIM cards, eight electrical contacts (but with as few as five being used) are specified in the ISO/IEC 7816 standard to be arranged on a surface of the card for contact by a host receptacle.

Sony Corporation has developed and commercialized a non-volatile memory card, sold as the Memory Stick™, that has yet another set of specifications. Its shape is that of an elongated rectangle having 10 electrical contacts in a row and individually recessed into a surface adjacent one of its short sides that also contains a cut out corner for orientation. The card's size is 50.0mm. long by 21.5 mm. wide by 2.8 mm. thick.

A more recent Memory Stick Duo card is smaller, having dimensions of 31.0 mm. long by 20.0 mm. wide by 1.6 mm. thick. Ten contacts are provided in a common recess in a surface and along a short side of the card, which also contains an orienting notch. This smaller card is often used by insertion into a passive adapter having the shape of a Memory Stick card.

SanDisk Corporation has introduced an even smaller transportable non-volatile TransFlash memory module in a modified rectangular shape, having dimensions of 15.0 mm. long by 11.0 mm. wide by 1.0 mm. thick. Eight electrical contact pads are provided in a row on a surface adjacent a short edge of the card. This card is useful for a variety of applications, particularly with portable devices, and is being incorporated into multimedia camera cell telephones.

As is apparent from the foregoing summary of certain electronic card standards, there are many differences in their physical characteristics including size and shape, in the number, arrangement and structure of electrical contacts and in the electrical interface with a host system through those contacts when the card is connected with a host. Electronic devices that use electronic cards are usually made to work with only one type of card. Adaptors, both active and passive types, have been provided or proposed to allow some degree of interchangeability of electronic cards among such host devices. U.S. Pat. No. 6,266,724 of Harari et al. describes use of combinations of mother and daughter memory cards.

Small, hand-held re-programmable non-volatile memories have also been made to interface with a computer or other type of host through a Universal Serial Bus (USB) connector. These are especially convenient for users who have one or more USB connectors available on the front of their personal computers, particularly if a receptacle slot for one of the above identified memory cards is not present. Such devices are also very useful for transferring data between various host systems that have USB receptacles, including portable devices. Mechanical and electrical details of the USB interface are provided by the "Universal Serial Bus Specification," revision 2.0, dated Apr. 27, 2000. There are several USB flash drive products commercially available from SanDisk Corporation under its trademark Cruzer. USB flash drives are typically larger and shaped differently than the memory cards described above.

Another, higher transfer rate interface that has become commonplace on personal computers and other host devices is specified by the following standard of the Institute of Electrical and Electronics Engineers (IEEE): "IEEE Standard for a High Performance Serial Bus," document no. IEEE 1394-1995, as amended by document nos. IEEE 1394a-2000 and IEEE 1394b-2002. A common commercial form of this bus interface is known as FireWire. Because of its higher speed, this interface is particularly useful for the transfer of large amounts of data to and from a computing device.

An electronic circuit card herein, such as one containing re-programmable non-volatile memory, includes at least one set of external contacts and a cover that is rotatable by hand about an axis extending across the width of the card to expose the contacts for insertion of that portion of the card into a mating host receptacle. In a specific example, the contacts and portion of the card carrying the card conform to the USB plug standard. The internal memory of a memory card, most commonly flash memory, is operable with the host through the set of contacts with an appropriate signal protocol. The cover is hinged to the card at the axis in a manner that allows the cover to be rotated with respect to the card approximately one-hundred eighty degrees between closed and opened positions that cover and expose, respectively, the at least one set of contacts. In a particular example structure, the cover is hinged with the card in a manner that provides positive detents that hold the card in at least an opened position, and optionally also in a closed position. The hinge may also be made to positively hold the lid partially opened, such as at ninety degrees to the memory card. The lid is rotated between these positions by finger manipulation to overcome the slight retaining force provided of the detents.

The cover may include a hand manipulated positive latch that engages a mating structure on an end of the card adjacent the set of contacts in order hold the cover positively closed over the set of contacts. Such a latch may be included along with the hinge detents or alternatively provided in a card structure that utilizes a cover hinge without the detents. The latching mechanism preferably automatically latches the cover to the card when the cover is closed. In order to open the cover, an element within the cover is manipulated by hand to release the latch. In one specific embodiment, this element is moved away from the end of the card containing the electrical contacts against the force of a spring within the cover that tends to hold the latch closed. In another specific embodiment, this element is slid along an end of the cover to disengage it from a mating latching surface at the end of the card.

Additional aspects, advantages, features and details of various aspects of the present invention are included in the following description of exemplary embodiments thereof, which description should be taken in conjunction with the accompanying drawings.

All patents, patent applications, articles, manuals, standards, specifications, other publications and things referenced herein are hereby incorporated herein by those references in their entirety for all purposes.

To the extent of any inconsistency or conflict in the definition or use of terms between any of the incorporated publications, documents or things and the present application, those of the present application shall prevail.

BRIEF DESCRIPTION OF THE DRAWINGS

FIGS. 1A and 1B are perspective views of a memory card having two sets of electrical contacts with a cover of one set of contacts closed (FIG. 1A) and with the cover opened (FIG. 1B);

FIGS. 2A and 2B are plan views of the memory card as shown in FIGS. 1A and 1B, respectively;

FIG. 3A is a side view of the memory card shown in FIGS. 1A-2B with its cover closed, as viewed from position 3A-3A of FIG. 2A;

FIG. 3B is a side view of the memory card shown in FIGS. 1A-2B with its cover in a position intermediate of its open and closed positions;

FIG. 3C is a side view of the memory card shown in FIGS. 1A-2B with its cover opened, as viewed from position 3C-3C of FIG. 2B;

DESCRIPTION OF EXEMPLARY EMBODIMENTS

Figure 4A:
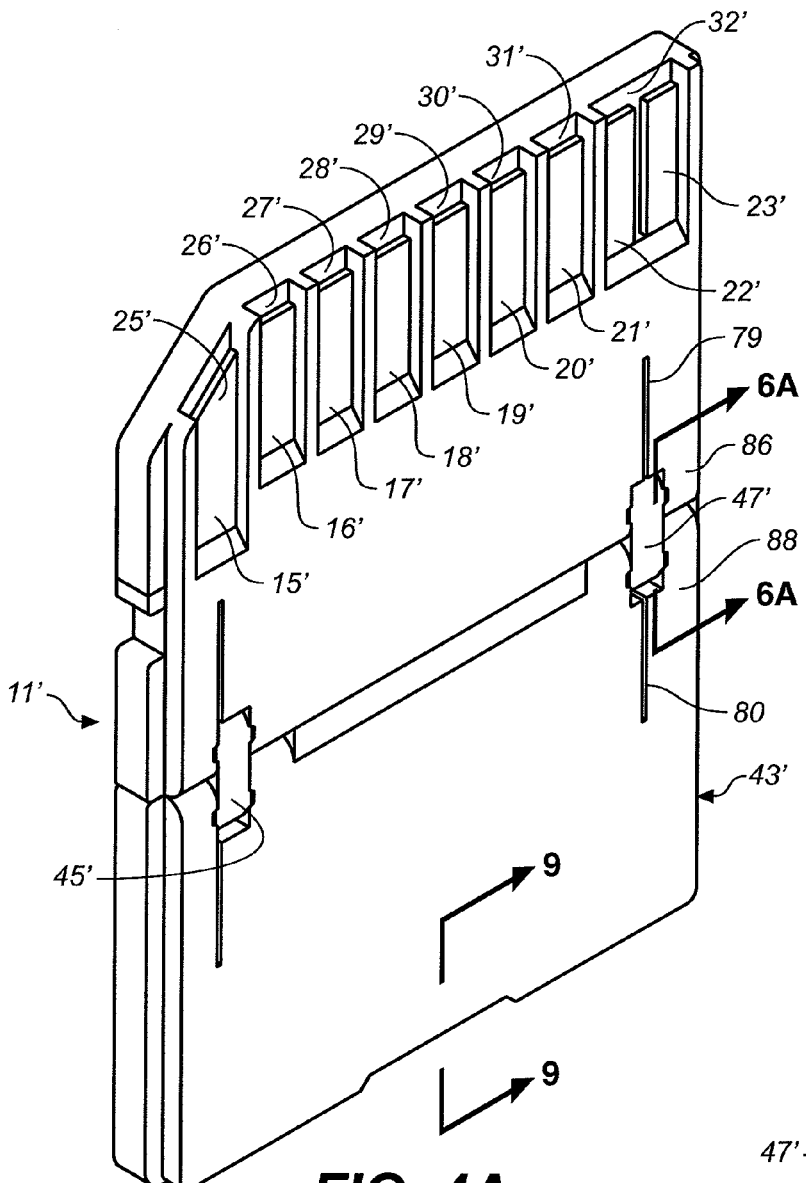
FIGS. 4A, 4B and 4C show a specific example of a memory card, in isometric views, with its cover respectively closed, partially opened and fully opened.

The memory card described herein as a specific example utilizes one set of contacts and a signal protocol from one published memory card standard, such as that for the SD card, and the other set of contacts and a signal protocol according another published standard, such as the USB standard or another that provide similar opportunities for use, such as the IEEE 1394 standard. Many types of hosts include receptacle slots for SD cards, particularly cell phones, PDAs, MP-3 players, cameras and the like, while USB receptacles are common in personal computers, notebook computers and the like. Such a combination of interfaces thereby allows the memory card system to be used directly with a wider variety of host devices than either one alone.

Referring to the figures, an example memory card will be described. A predominately rectangular main body portion 11, in this case a shortened version of the SD card, has a rectangular extension 13 formed as part of the card to provide an additional interface, in this case a USB compatible plug. Since the extension 13 is narrower than the portion 11, end surfaces 12 and 14 of the main body portion 11 exist on either side of the extension 13. According to the SD Memory Card Specifications, nine electrical contacts 15-23 are provided on bottom surfaces of eight grooves 25-32 along one end of the card, the two contacts 22 and 23 being placed in the one groove 32. Four electrical contacts 37-40, arranged in a row according to the USB specifications, are provided on the flat surface of the extension 13. Both sets of contacts 15-23 and 37-40 are positioned on the same side of this example memory card but they could alternately be placed on opposite sides.

In order to protect the contacts 37-40 when not being used, a cover 43 is rotatably connected with the card so that it may be closed to cover the contacts 37-40 when they are not being used (the position of FIGS. 1A, 2A and 3A) and opened to expose the contacts 37-40 when the extension 13 is inserted into a matting receptacle (the position of FIGS. 1B, 2B and 3C). These positions are shown to be one hundred eighty degrees apart. In this specific example, the cover 43 is attached to the card portion 11 at its end surfaces 12 and 14 by respective hinges 45 and 47 that allow for such rotation of the cover 43 by hand. The cover therefore is rotated about at least one axis extending across the width of the card and, in this case, at about the junction of the card portions 11 and 13. The cover 43 has thick side portions 49 and 51 to which the hinges 45 and 47 are respectively connected. The side portions 49 and 51 fit around the extension 13 when the cover is closed, and a thin layer 53 of material spanning between the side portions 49 and 51 covers the contacts when the cover 43 is closed. The layer 53 has a size that is approximately that of the extension 13 in order to cover it when the cover 43 is closed. An end portion 55 spanning the side portions 49 and 51 is also preferably provided as part of the cover 43. When the cover 43 is closed, its end portion 55 fits over an extreme end of the extension 13.

In order to be compatible with the USB specifications, the addition 13 has a minimum length of 12 mm. from the ends 12 and 14 of the main body portion 11 and has a width of 12.35 mm. The main body portion 11 of the memory card of FIGS. 1A and 1B, in this specific example, is 24 mm. wide with a thickness of 2.1 mm., according to the SD card standard, but its length is shortened so that the overall length of the card, with the cover 43 closed, is the 32 mm. length of the SD card. The cover 43 is made to have the same outside width of 24 mm. and its side portions 49 and 51 the same 2.1 mm. thickness as the card portion 11, according to the SD card standard. The extension 13 has a thickness 43 of 1.70 mm. in the region of the contacts 37-40, according to the USB specifications, which is less than the 2.1 mm. SD card thickness of the portion 11. A 0.4 mm. high ledge may thus be formed at the intersection of the card portions 11 and 13, given their different thicknesses, while an opposite surface on the backside of the first and second portions 11 and 13 is planar without any such discontinuity. The thickness difference on the front side is occupied by the layer 53 when the cover 43 is closed. The length of the cover 43 is such that the length of the card with the cover closed is the 32 mm. length of the SD card.

Therefore, when the cover 43 is closed, the card structure has the physical dimensions and other physical characteristics of the SD memory card. In order to hold the cover closed, a latch 57 may be provided on the inside of one or both of the side portions 49 and 51 of the cover 43 to snap into mating receptacle(s) (not shown) on the side walls of the extension 13. When the cover 43 is closed, the card can be used as any SD card, the same as if the USB extension portion 13 did not exist. It is inserted into and removed from receptacles of host devices that follow the SD card standard. However, when it is desired to insert the card into a USB receptacle, the cover 43 is opened to expose the extension 13 and its contacts 37-40. An appropriate latch (not shown) may additionally be included to hold the cover 43 in its opened position.

In the example shown in the figures, the length of the extension 13 has been minimized according to the USB standards in order to maximize the length of the main body portion 11 so that it may hold more or larger integrated circuit chips. This results in the cover 43, when in its opened position shown in FIG. 1B, not covering the contacts SD card contacts 25-32. This is not a problem since the contacts 25-32 are included in grooves that minimize touching when being handled and are in any event normally so exposed in SD cards. However, if it is desired for the cover 43 to lie over the contacts 25-32 when opened, the length of the main portion 11 can be shortened and the extension 13 lengthened by a corresponding amount until they have about equal lengths. The length of the cover 43 would also then be increased in order to cover the lengthened extension 13. When in its opened position, the cover would lie over the SD card contacts 15-23. This is the case in the more detailed examples described below with respect to FIGS. 4A-15.

The extension 13 is illustrated in the figures to be centered along the width of the card portion 11, the end edges 12 and 14 of the body portion 11 therefore being equal. However, other arrangements can be used instead. For example, the extension 13 can be positioned along one side of the portion 11 and the cover 43 altered to have one larger side portion instead of the two equal side portions 49 and 51 that are illustrated.

Various other details of the example structure shown in the figures can certainly be further altered so long as the contact structure at one end physically conforms to one standard and the contact structure at the other end physically conforms to a second standard. One is a memory card standard since numerous hand held devices include receptacles for such cards. A memory card standard other than for the SD card, such as one of the others described above, can be utilized instead. The second standard is one that is more commonly used on personal computers, notebook computers and other computing devices, in this case the USB standard. The IEEE 1394 standard could instead be used for the second standard, for example, but its use is currently not as widespread as the USB. Alternatively, both sets of contacts may conform to different memory card standards.

Internal to the memory card is preferably flash memory that is accessed from the SD card contacts 15-23 through a controller circuit, as currently exists in SD memory cards. An additional interface circuit is provided for converting the SD signal protocols at the SD contacts 15-23 into USB signal protocols at the USB contacts 37-40. Alternatively, a single controller can be used to provide both signal protocols. If one or more additional sets of contacts are provided, provision is made to interface the additional set(s) of contacts with the signal protocols of the additional standard(s), so that the internal memory can be accessed through the additional contact set(s).

Because of the two interfaces, the memory card of is useable with a wide variety of types of host devices. The SD card set of contacts 15-23 can be inserted into a memory card slot of a PDA, for example, and the other set of contacts 37-40 into a USB receptacle of a notebook computer. Addition of the second interface increases the convenience and portability of the memory card. This is an advantage for most all uses of memory cards but is of particular benefit in certain applications. For example, if the memory card stores the medical history and other health information of an individual who is carrying the card at the time of an accident or sudden illness, it is more likely that emergency health care providers will have access to a host device that can immediately read the stored information from the card through either of the two interfaces. The two interfaces also increase the usefulness of a memory card for transferring data between different types of hosts that do not have a common card interface.

The second pattern of contacts and hinged protective cover of the card shown in the figures can be included in a memory card based upon most any memory card standard. This structure is not limited to use with the SD card. The USB plug 13 can, for example, be incorporated in a similar manner into the MMC, miniSD, Memory Stick, Smart Media or other standard card.

The specific hinges 45 and 47 shown in the example memory card of the figures are sometimes called "dog bone" hinges. They are of rigid material. One end of each of these elongated hinges is attached to the card portion 11 to rotate about an axis 61 that extends across the width of the card through its main portion 11. Another end of each of the hinges 45 and 47 is attached to the cover 43 to rotate about an axis 63 that extends across the width of the cover 43. Both of the axes of rotation 61 and 63 are stationary with respect to their respective card portion 11 and cover 43. During movement of the cover between its opened and closed positions, the axis 63 moves normal to the memory card to allow the cover 43 to adjust between the different levels of the card's top surface. It will also be noted from the views of FIGS. 3A-3C that the mating edges of the cover 43 and main card portion 11 are curved to allow smooth motion between them as the cover 43 is moved by hand between its open and closed positions. The axis 63 also moves laterally along the length of the memory card as the cover is being opened or closed.

This hinge structure can also be modified to provide a detent that holds the cover 43 in its closed position (FIG. 3A), in place of the latch 57 (FIG. 1B), and in its opened position (FIG. 3C). One way to do so is to square off the ends of the rigid hinges 45 and 47 and provide mating rectangular receptacles in the card portion 11 and cover 43 that latch the cover at 0° and 90° with respect to the hinges but allows free rotation between those positions. An alternate structure replaces the rounded edges of the card portion 11 and the cover 43 with substantially square surfaces, and the hinges 45 and 47 are provided some degree of elasticity so that they pull these planar edges together when the cover 43 is closed. As the cover is then opened by hand, the hinges stretch to allow the edge of the cover to rotate over the edge of the card portion 11 and then pull the cover and card together again after the cover has been rotated into its opened position.

Other alternatives to this specific hinge structure can certainly be used, so long as the cover 43 is rotatable by hand with respect to the card portions 11 and 13 about one or more axes extending across the width of the card. A different type of solid mechanical hinge can be used, for example. Or something altogether different can be used. A flexible member adhered to the cover and the main card portion 11, for example, may be substituted for the mechanical hinges. An example of the flexible member is polyimide film bonded or welded to the hinged pieces.

FIGS. 4A-9 show in detail an electronic card product that specifically implements certain aspects of the card designs described above. Structural elements of the memory card of FIGS. 4A-9 described below that correspond with elements of FIGS. 1A-3C described above are therefore identified with the same reference numbers but with a prime (') added. Many of these corresponding elements are therefore not described again with respect to FIGS. 4A-9, in which case the prior descriptions of the elements in FIGS. 1A-3C are incorporated into the following description.

A main body portion 11' of the card of FIGS. 4A-9 has a cover 43' attached to the body 11' by solid, rigid hinges 45' and 47' that have the same shape. The cover 43' is rotatable with respect to the body 11' over a range of substantially 180 degrees between closed (FIG. 4A) and opened (FIG. 4C) positions. The relative dimensions of the body 11' and cover 43' are such that the cover overlies a portion of the card contacts 15'-23' when the cover is opened (FIG. 4C). A USB plug extension 13' is exposed for use when the cover is opened. When the cover is closed (FIG. 4A), the card has a shape, including thickness, of the SD card and can be used as a SD card.

Figure 4B:
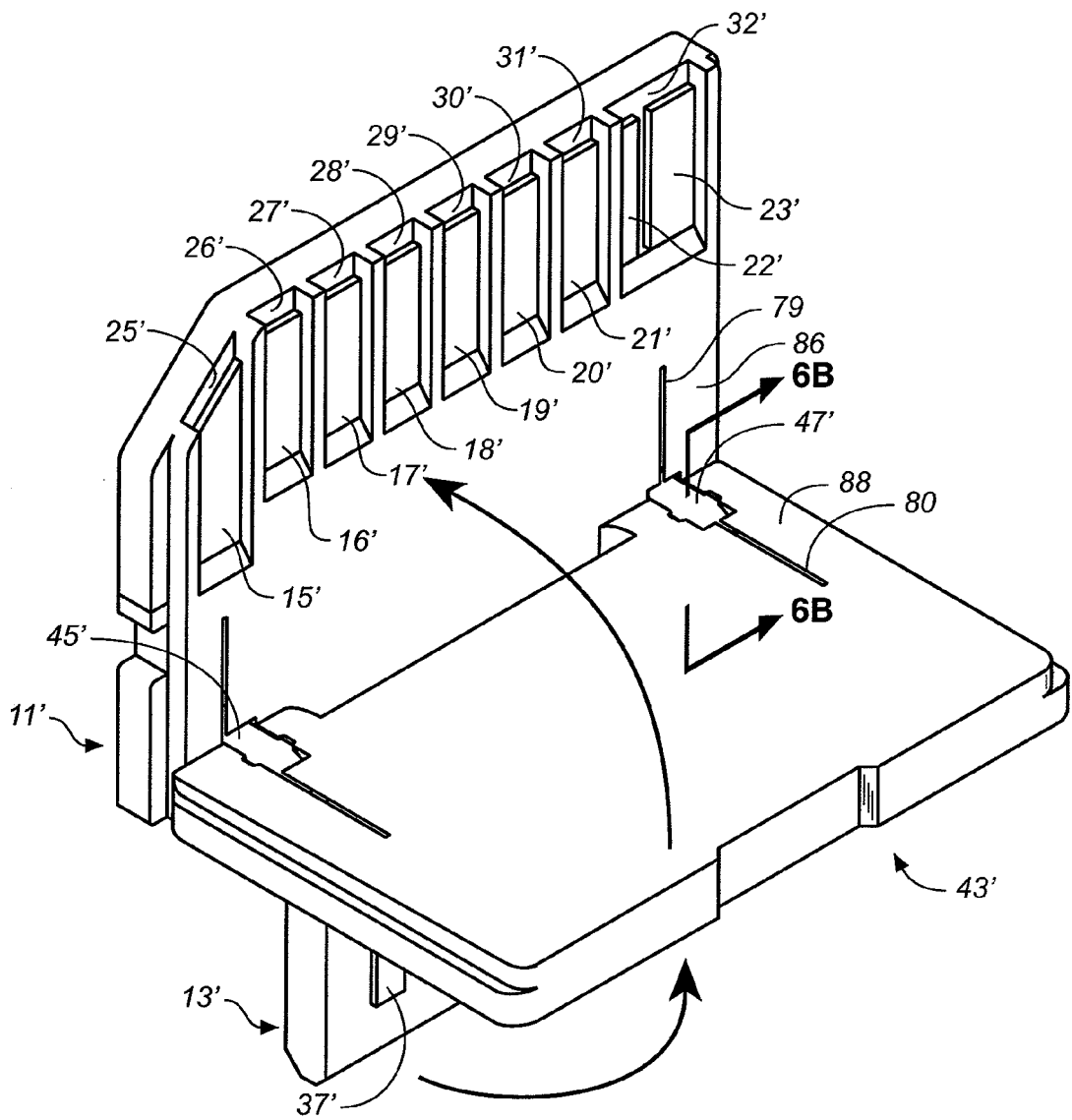
Figure 9:
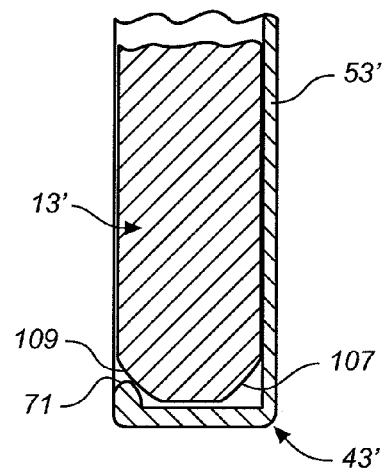
FIG. 9 is a sectional view of an edge of the card and cover taken through section 9-9 of FIG. 7.
Figure 8A:
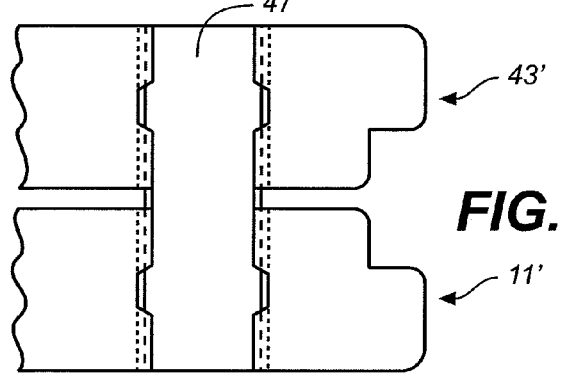
FIG. 8A is an enlarged view of a portion of the card of FIG. 8 that is surrounded by a dashed line marked 8A.
Figure 10:
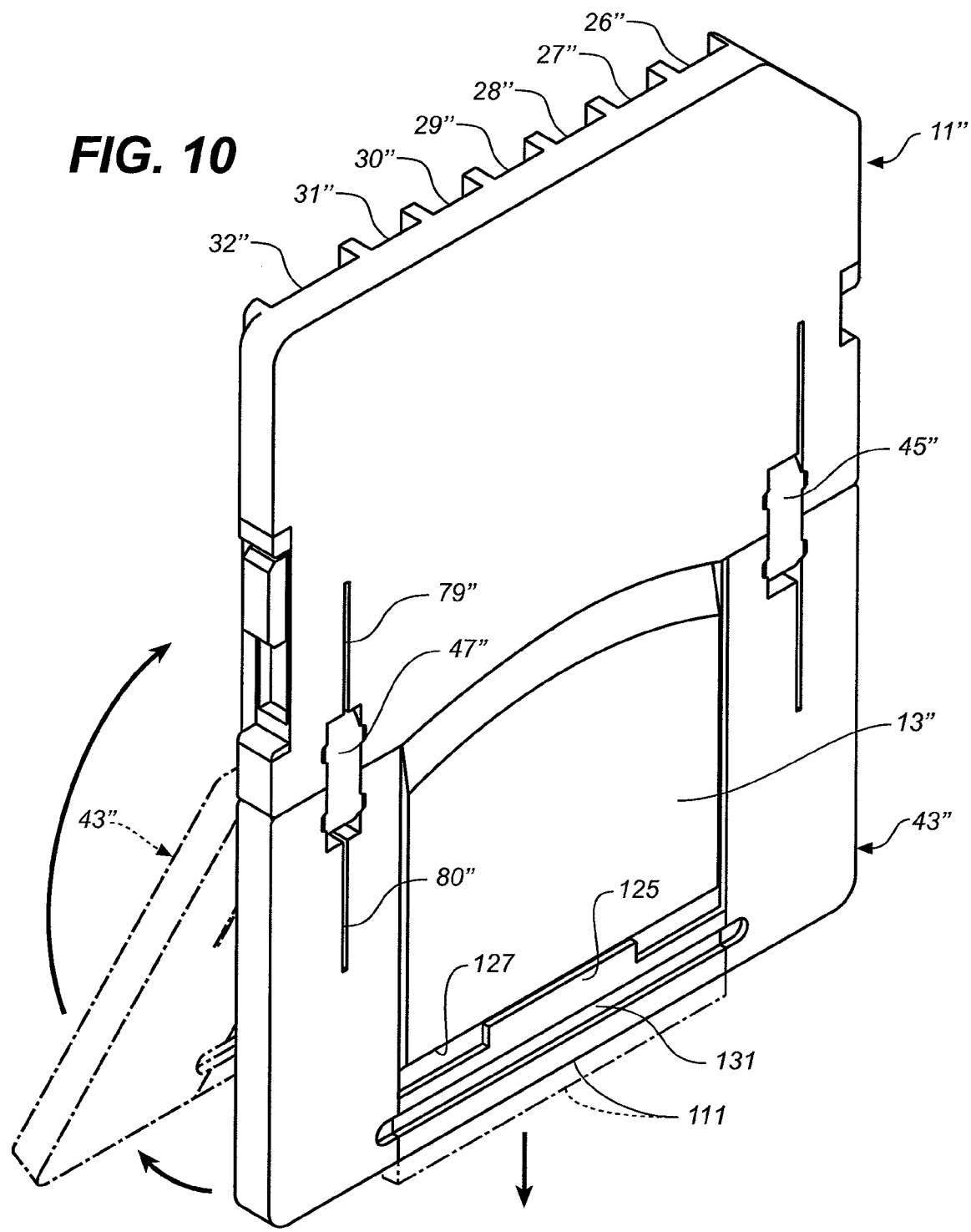
FIG. 10 is an isometric view of a card similar to that shown in FIGS. 1-9 but which additionally includes a first specific embodiment of a hand releasable mechanism that positively latches the cover in a closed position.

The shapes of the hinges and mating surfaces of the card body and cover provide three stable positions of the cover: closed (FIG. 4A), opened (FIG. 4C) and an optional intermediate position (FIG. 4B). The cover is latched into one of these stable positions by a user manipulating the parts with his or her fingers. They are separated by substantially 90 degrees. The latching may be overcome by gentle finger force that rotates the cover out of any one of these stable positions. Although this is, in this example, the only mechanism that holds the cover fully opened (FIG. 4C), a more positive latch is also included to hold the cover closed (FIG. 4A). As best shown in FIG. 9, a lip 71 is provided on an underside of the cover 43' that flexes outward around the extension 13' as the cover is closed to positively latch the extension 13' when the cover reaches the position shown.

A layer 53' across the cover is preferably provided with indentations 73-76 having positions and shapes that match electrical contacts 37'-40' raised above a surface of the extension 13'. When the cover is closed (FIG. 4A), the contacts fit within these indentations to allow the cover layer 53' to abut against surface area of the extension 13' surrounding the contacts 37'-40'.

The structure and operation of the hinge 47' will now be described. The structure and operation of the hinge 45' is the same. A slot 79 extends completely through the body 11' for a distance from its edge where the hinge 47' is held. Similarly, a slot 80 goes all the way through the cover 43' for a distance from an edge that retains the hinge 47'. The hinge 47' is held within these slots. These slots form respective strips 86 and 88 that flex outward as the hinge 47' is rotated with respect to the respective body 11' and cover 43' between the three stable positions, thereby expanding the width of the slots 79 and 80. The strips 86 and 88 resiliently return to their rest positions when the cover is in one of the three stable positions shown in FIGS. 4A, 4B and 4C, urging against the hinge 47'.

The structure and operation of the hinge 47' may best be explained by reference to the exploded views of FIGS. 6A, 6B and 6C that show relative positions of the parts when the cover is in the closed, intermediate and opened positions of respective FIGS. 4A, 4B and 4C. The hinge 47' is a solid plastic piece with first and second cylindrical axels 81 and 83 that each extend out of opposite sides of the part and are spaced apart along its length. The hinge 47' therefore rotates about axes 82 and 84 of the respective axles. A pattern of ridges 85, 87 and 89 protrude out from a planar surface 91 on one side. The structure on the opposite side is the same. The ridge 85 extends along the length of the hinge 47' through both of the axels 81 and 83. The ridges 87 and 89 extend across the width of the hinge through one of the axels 81 and 83, respectively, perpendicular to the ridge 85. In cross-section, the ridges are narrower at their tops than at their bottoms where they intersect the hinge surface 91. In this example, their sidewalls are also planar and intersect top planar surfaces of the ridges and the hinge surface 91 with a common angle other than ninety degrees.

Surfaces of the body 11' and cover 43' that engage the sides of the hinge 47' have a complementarily shape. The surfaces that engage one side of the hinge 47' are shown in FIGS. 6A, 6B and 6C. A cylindrically shaped hole 95 on the main body 11' receives one end of the axle 81 on the backside of the hinge 47' in a manner that allows the axle to rotate with respect thereto. Similarly, the cover 43' includes a cylindrically shaped hole 97 into which one end of the axle 83 is inserted to rotate with respect to the cover. The body 11' includes channels 99 and 101 that extend through the opening 95 and are perpendicular with each other. Similarly, channels 103 and 105 pass through the opening 97 of the cover 43' and are perpendicular with each other. In cross-section, the channels 99, 101, 103 and 105 are the same along their lengths and mate with the common shaped ridges 85, 87 and 89 of the hinge 47'. In this example, the channels have planar bottom surfaces that are narrower than the widths of their openings, and their sidewalls are also planar. The sidewalls therefore intersect the bottom surface of the grooves and a planar surface surrounding the grooves with angles that are other than ninety degrees.

Figure 6A:
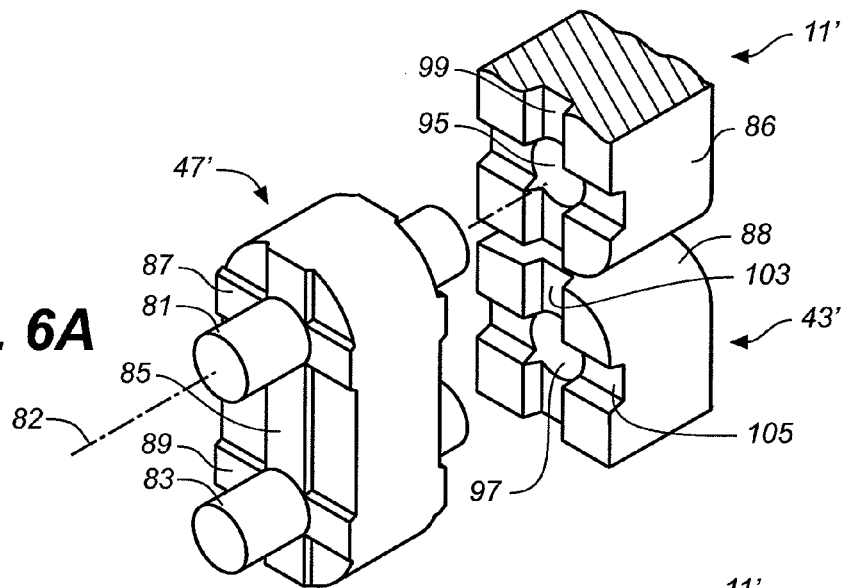
FIGS. 6A, 6B and 6C are exploded isometric views that further illustrate relative rotational positions of the hinges and mating surfaces of the memory card and cover when the cover is in the positions shown by respective FIGS. 4A, 4B and 4C.
Figure 6B:
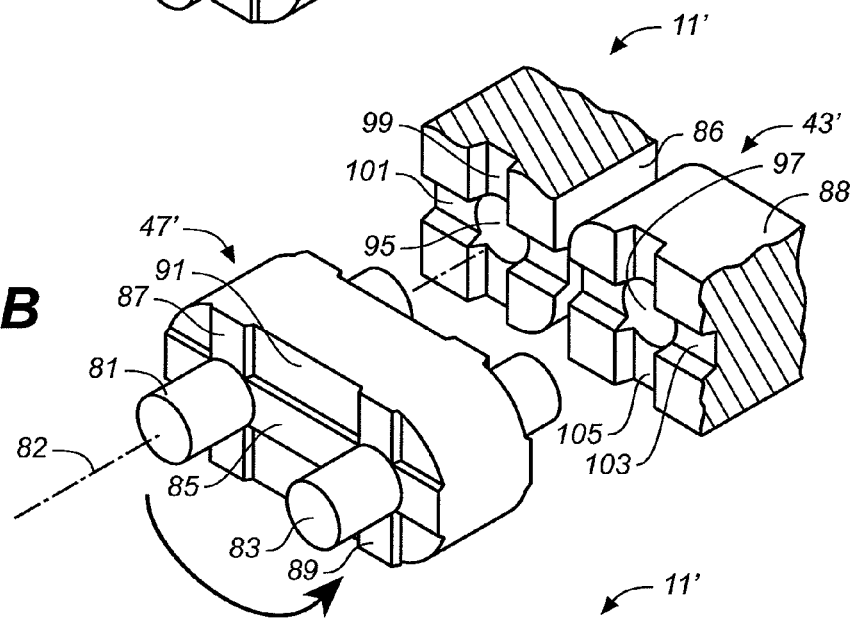
Figure 6C:
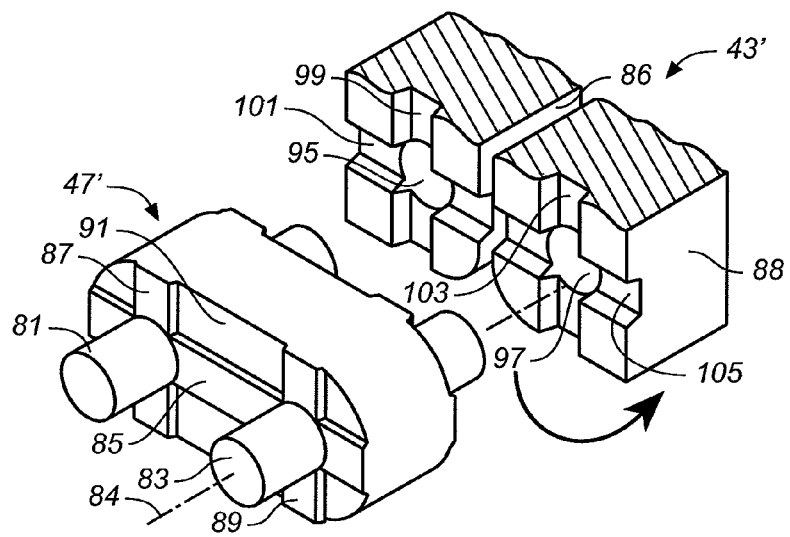
Figure 7:
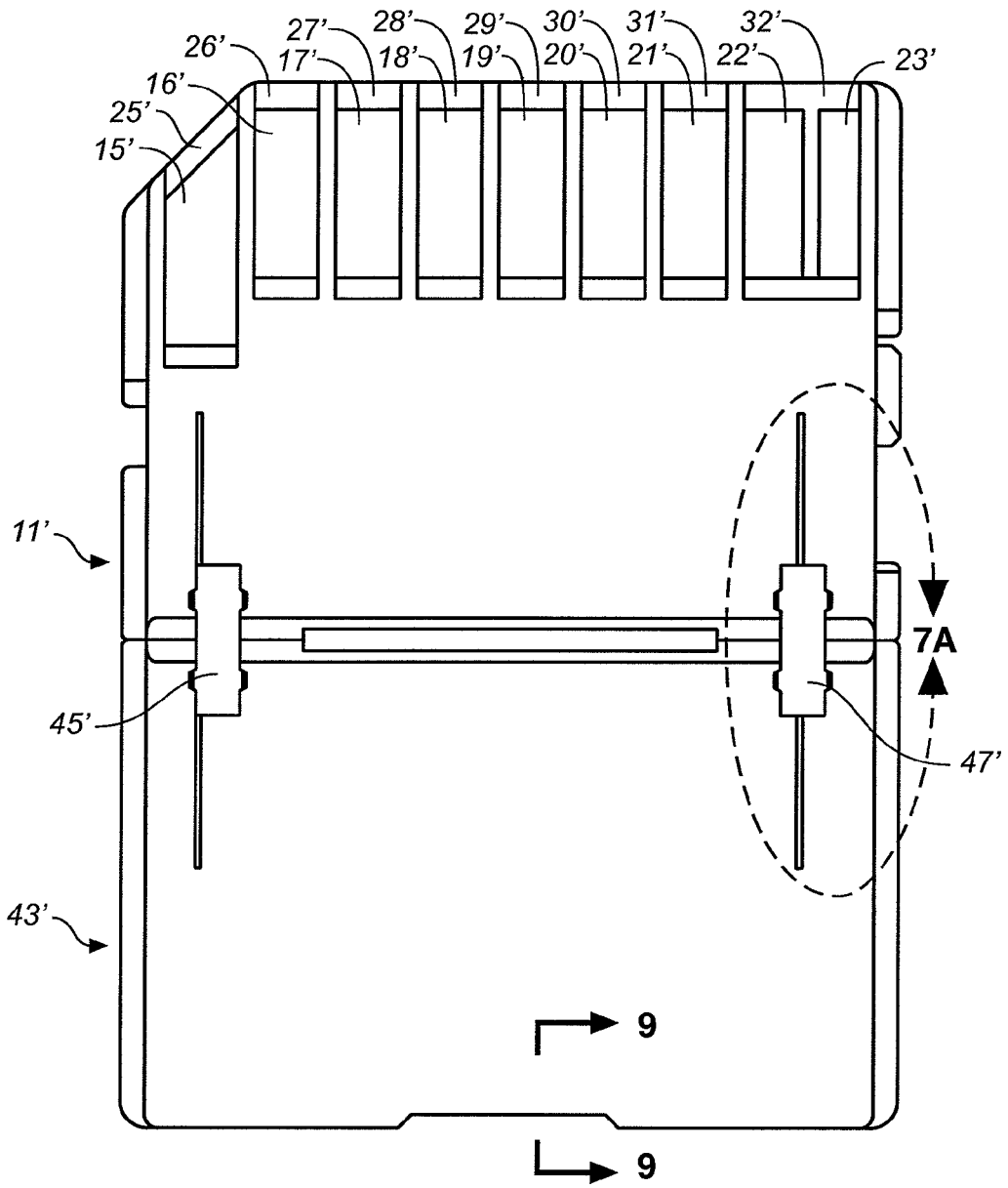
FIG. 7 is a front plan view of the memory card shown in FIG. 4A, its cover being closed.
Figure 8:
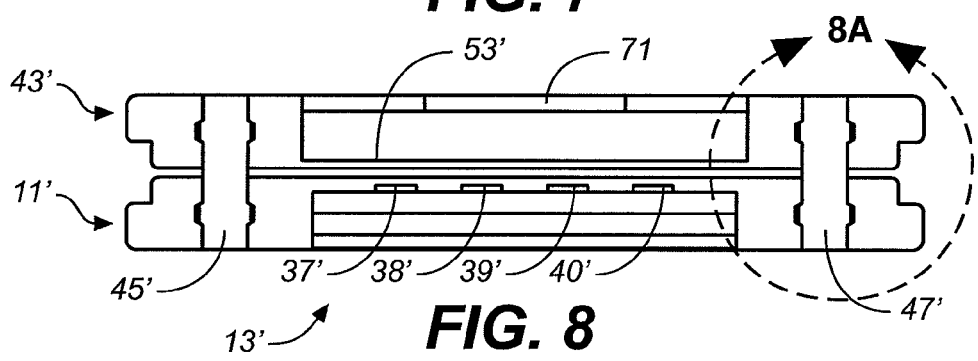
FIG. 8 is a bottom edge view of the memory card shown in FIG. 4C, its cover being fully opened.
Figure 7A:
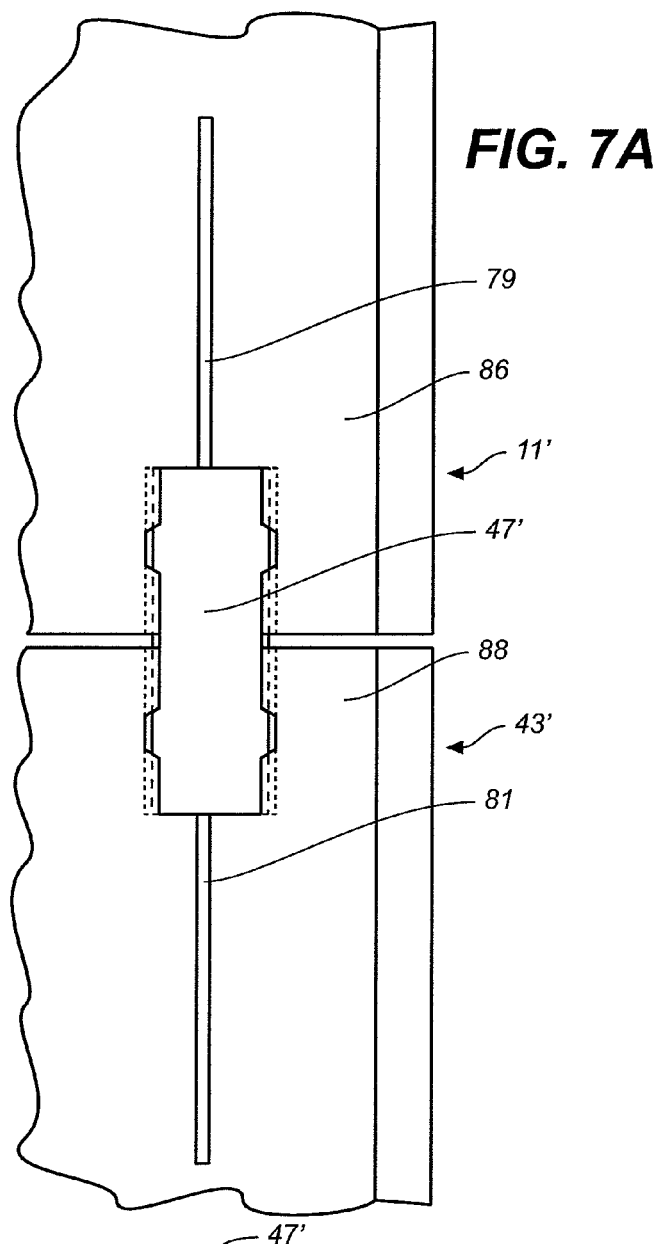
FIG. 7A is an enlarged view of a portion of the card of FIG. 7 that is surrounded by a dashed line marked 7A.

Operation of the hinge 47' when the cover 43' is opened or closed can best be seen by comparing the views of FIGS. 6A, 6B and 6C. FIG. 6A shows the relative position of the parts when the cover is closed (see FIG. 4A). The ridge 85 on the opposite side of the hinge 47' is positioned in the channels 99 and 105 of the body 11' and cover 43', respectively. The ridge 87 on the opposite side of the hinge is positioned in the channel 101 of the body 11', and the ridge 89 in the channel 105 of the cover 43'

As the cover is opened, the hinge 47' does not move with respect to the cover 43' but does rotate about the axis 82 with respect to the body 11'. As the cover begins to rotate, the ridges 85 and 87 of the hinge 47' move out of the respective channels 99 and 101 of the body 11'. This is possible since the strip 86 is resiliently movable to the side away from the hinge. The mating sloping sides of the ridges and channels causes a caming action that pushes against the resiliently loaded strip 86 as the ridges are forced out of the channels. When the cover has been rotated ninety degrees to the intermediate position of FIG. 4B, the hinge and cooperating surfaces are caused to again engage each other because of the resilience of the strip 86 urging them together. The parts are then in the relative positions shown in FIG. 6B. The ridge 85 is then positioned within the channel 101 of the body 11' and the ridge 87 in the channel 101. The body 11' has not moved but the cover 43' and the hinge 47', which remain locked together, have rotated ninety degrees about the axis 82 with respect to the body 11'.

Figure 4C:
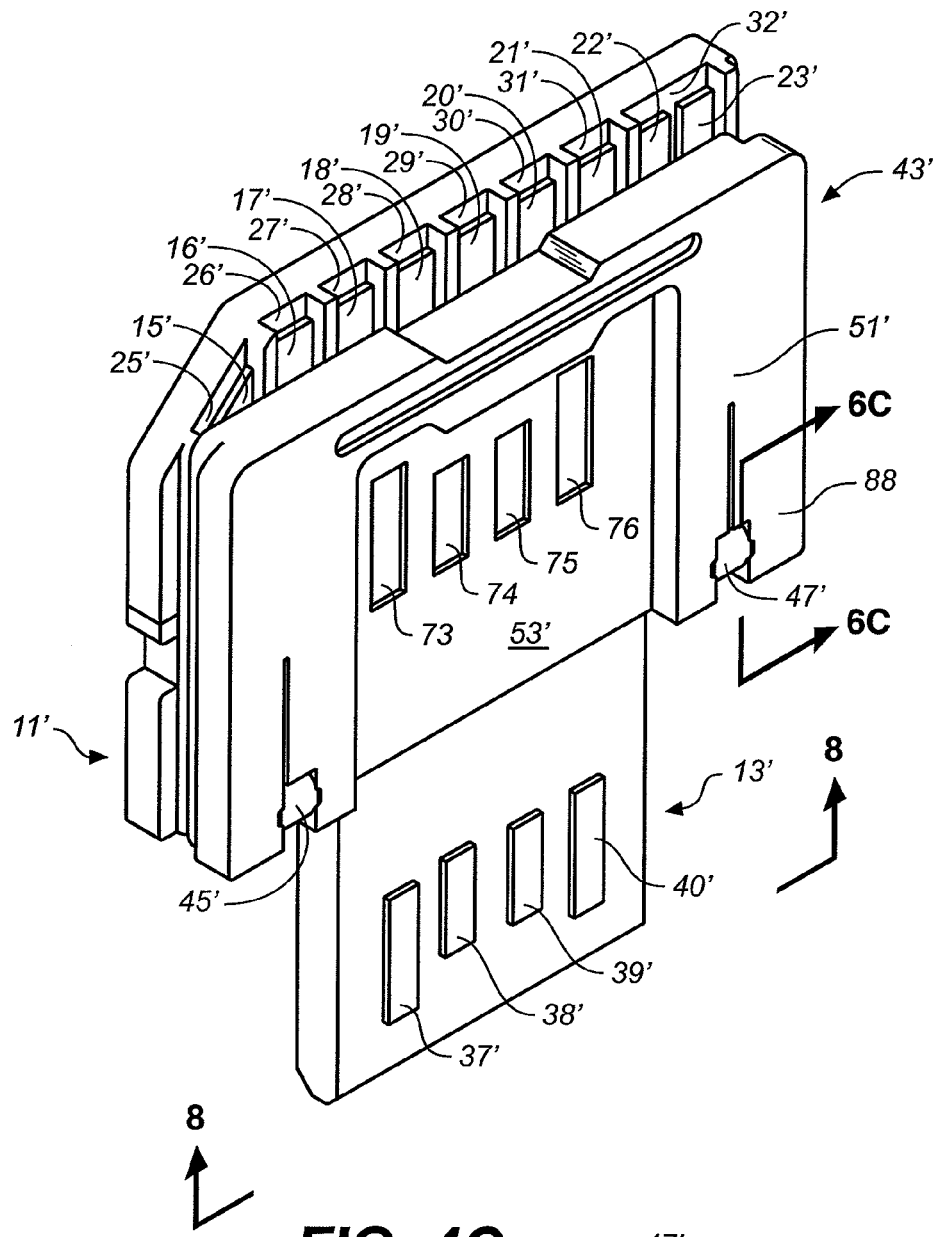

Further rotation of the cover 43' moves the parts to their relative positions shown in FIG. 6C, where the cover is fully opened (see FIG. 4C). The hinge 87' remains locked to the body 11' as the cover 43' is rotated ninety degrees with respect to the hinge 47' about the axis 84. At the beginning of this rotation, the ridges of the hinge move out of the channels of the cover by the cam action that urges the strip 88 laterally away from the hinge. After the cover is rotated ninety degrees, the ridges 85 and 89 of the hinge 47' are urged into the respective channels 105 and 103 of the cover 43', the position shown in FIG. 6C.

It will be noted that the ridge 87 of the hinge 47' and a portion of the ridge 85 adjacent to it mate with the channels 99 and 101 of the card body 11'. If the hinge were free to rotate a full 360 degrees, these mating surface relief patterns would provide four stable rotational positions 90 degrees from each other about the first axis 82. Similarly, the ridge 89 and portion of the ridge 85 adjacent to it that mate with the channels 103 and 105 of the cover provide four similar stable rotatable positions between the hinges and the cover about the second axis 84. The mechanism is constrained, however, in this example, to utilize only two rotatable positions with the body 11' and two rotatable positions with the cover 43'. This combination provides the three stable rotatable positions between the cover and the card body that are illustrated in FIGS. 4A, 4B and 4C.

Although not explicitly shown, the second opposite surface of the hinge 47' is urged against opposing surfaces of the body and cover having the same shapes as those shown in FIGS. 6A, 6B and 6C. The hinge and these other surfaces cooperate in the same manner as described above.

Figure 5A:
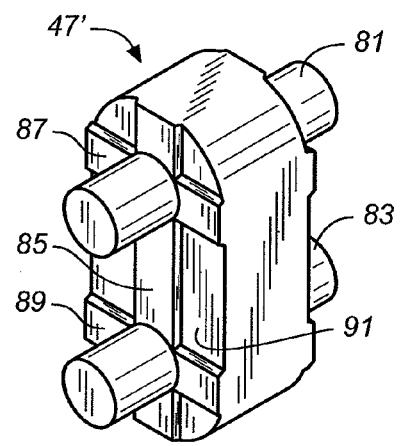
FIGS. 5A, 5B and 5C illustrate relative rotational positions of hinges that attach the cover to the memory card when the cover is in the positions of FIGS. 4A, 4B and 4C, respectively.
Figure 5B:
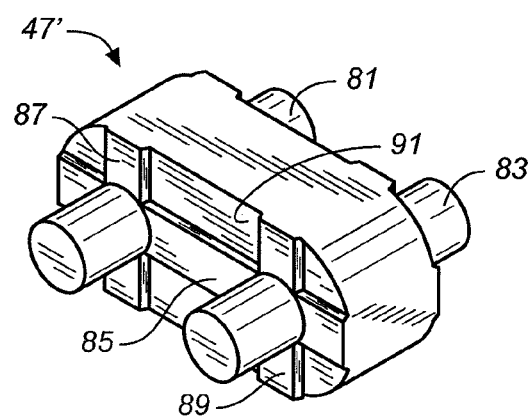
Figure 5C:
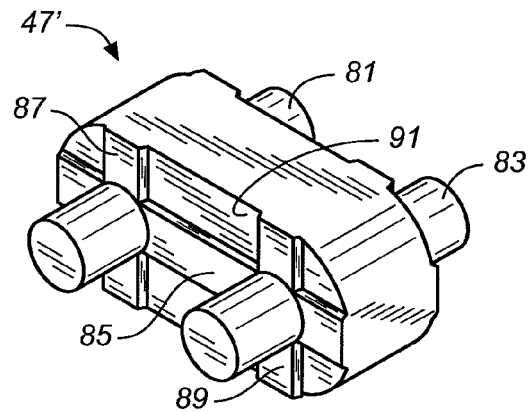

FIGS. 5A, 5B and 5C have not been discussed but it may be noted that they show relative orientations of the hinge 47' for the positions of the covers shown in respective FIGS. 4A, 4B and 4C.

The above-described card example of FIGS. 4A-9 utilizes a lip 71 (FIG. 9) on the underside of the hinged cover 43' that flexes outward as it rides over a surface 107 of the card extension 13' as the cover is closed by hand. This latches the cover 43' to the card extension 13' in the manner shown in FIG. 9. The cover 43' is opened by a finger contacting and rotating the cover about its axis, which causes the lip 71 to flex outward as it rides over another smooth surface 109 at the end of the card extension 13'. The gradual card extension end surfaces 107 and 109 are provided instead of sharp corners. The end wall of the cover 43' is made of thin enough plastic that it provides the necessary flexing and resilient urging of the lip 71 against these card end surfaces. These surfaces preferably extend along the full width of the card extension 13', while the lip 71 may have this same full width or only extend along a portion of it.

EXAMPLES WHERE THE COVER IS
MANUALLY UNLATCHED FROM ITS CLOSED
POSITION

In order to more positively latch the cover in its closed position, a latching mechanism may be added to the structure that is unlocked by hand to enable rotation of the cover out of its closed position. Two examples of this are described below, one with respect to FIGS. 10-12 and the other with respect to FIGS. 13-15. In these figures, elements corresponding to those shown in FIGS. 1A-9 are given the same reference number with a double prime (") added. In most cases, these common elements are not further described below. Rather, this description focuses on the hand manipulatable latching elements that are added to those structures. Although the cards are shown to include a second set of contacts in addition to the set that is covered by the rotating cover, the second set of contacts may be omitted if it is contemplated that the card will be used with only one type of host receptacle.

Figure 11:
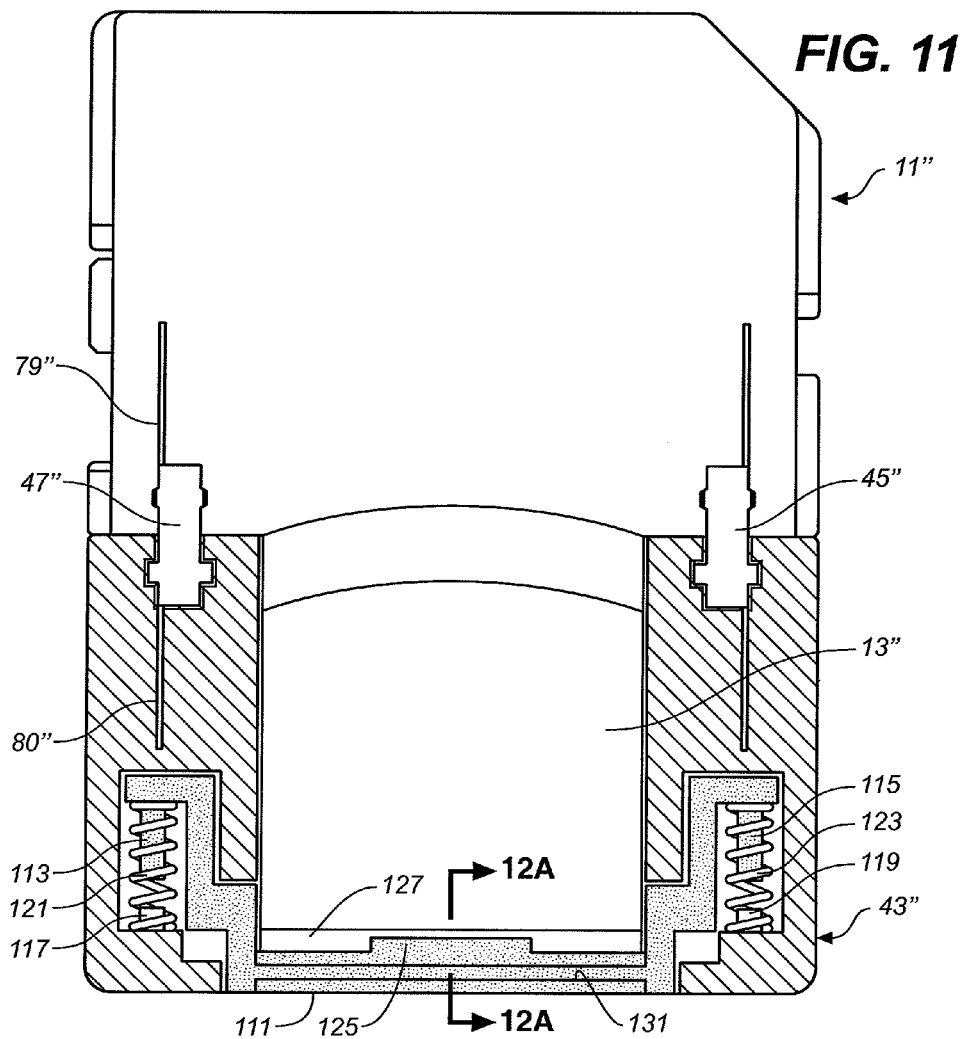
FIG. 11 is a plan view of the card of FIG. 10 with an outer skin of the cover removed.

Referring to the structure illustrated in FIGS. 10-12C, a latching element 111 is positioned within an end of the cover 43" that extends beyond an extreme end of the card extension 13". The element 111 is held in a manner to be slid out of the end of the cover by hand. As a unitary plastic piece, the element 111 extends to sides of the cover 43" on either side of the card extension 13". Each end carries one of posts 113 and 123. Posts 117 and 119 are also attached to opposite sides of the cover 43" within respective cavities therein. A distance between the posts 113 and 117 defines the extent of movement that is permitted by the element 111 out of the cover 43". The same distance is provided between the posts 115 and 119. Springs 121 and 123 hold the element 111 in a position within the cover 43" as shown in FIG. 11. Movement of the element 111 out of the cover 43" to unlatch the cover occurs against the compressive force of the springs 121 and 123.

Figure 12A:
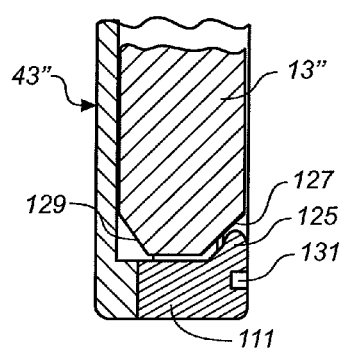
FIGS. 12A, 12B and 12C are sectional views taken through section 12A-12A of FIG. 11 with the cover and latching mechanism in different positions.
Figure 12B:
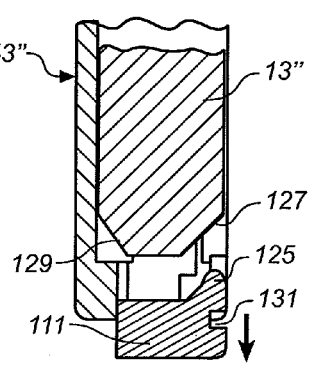
Figure 12C:
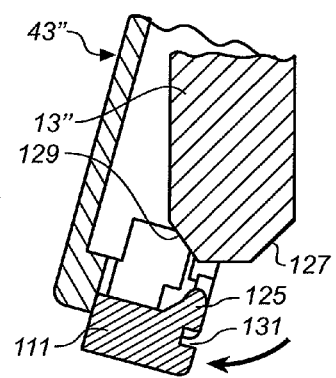

As illustrated in FIG. 12A, a lip 125 is provided within the element 111 in a position that contacts a surface 127 of the end of the card extension 13" when the cover is closed. The surface 127 is a cut-off corner of the end of the card extension 13". In order to unlock the cover, the element 111 is slide by hand out of the cover 43" to a position shown in FIG. 12B. The lip 125 is then positioned out of the way of the surface 127 and the cover may then be rotated away from the card extension 13", as shown in FIG. 12C. The lip 125 and surface 127 preferably extend the entire width of the extension 13" but both of them or just the lip 125 may alternatively be made shorter than this. The shape of the surface 127 may be planar as shown. The cover lip 125 and card surface 127 are effectively mating latching elements. The portion of the element 111 that extends across the cover 43" (shown in cross-section in FIGS. 12A-12C) is made rigid so that it does not bend if a user attempts to open the cover without first pulling the element 111 out of the cover 43". The lip 125 therefore does not bend and remains urged against the surface 127 of the extension 13" by a sufficient force of the springs 121 and 123 until the element 111 is pulled by hand out of the cover 43".

A corner of the end of the card extension 13" opposite the surface 127 is also provided with a surface shape 129. That shape may be made so that the cover 43" can be closed by urging the cover against the card extension 13" without first pulling out the latching element 111, if the strength of the springs 121 and 123 is also made to be low enough. Urging the surface 129 against the lip 125 in such a case is then translated into motion of the element 111 out of the cover 43". However, it is generally preferable to make the shape of the surface 129 and the strength of the springs 121 and 123 sufficient to require that the element be pulled out in the manner shown in FIG. 12C before closing the cover.

In order to facilitate the pulling of the element 111 out of the cover 43", a fingernail slot 131 is preferably provided along the width of the element 111 that is exposed at the rear of the cover. This is useful because of the very small dimensions involved.

Figure 13:
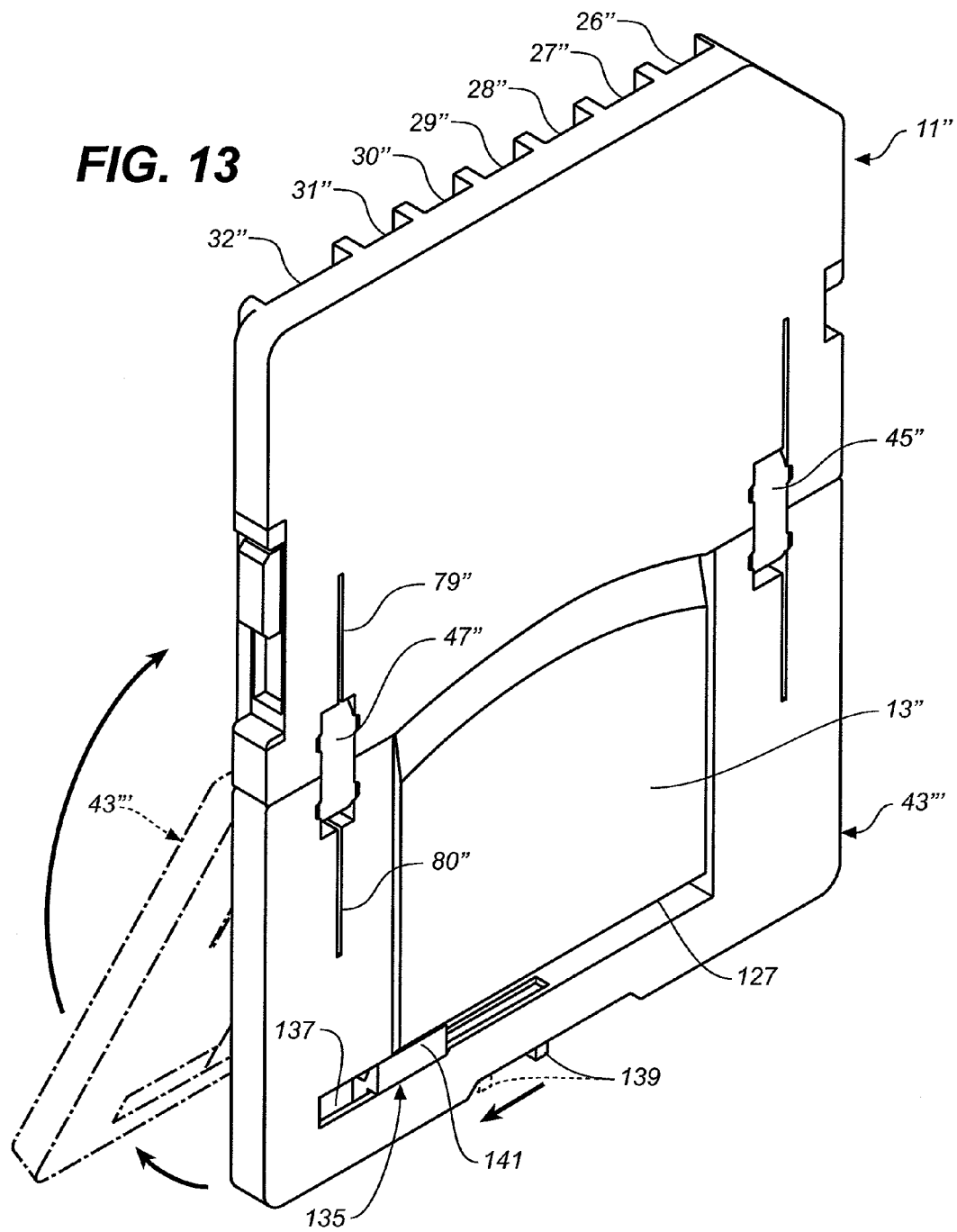
FIG. 13 is an isometric view of a card similar to that shown in FIGS. 1-9 but which additionally includes a second specific embodiment of a hand releasable mechanism that positively latches the cover in a closed position.
Figure 14A:
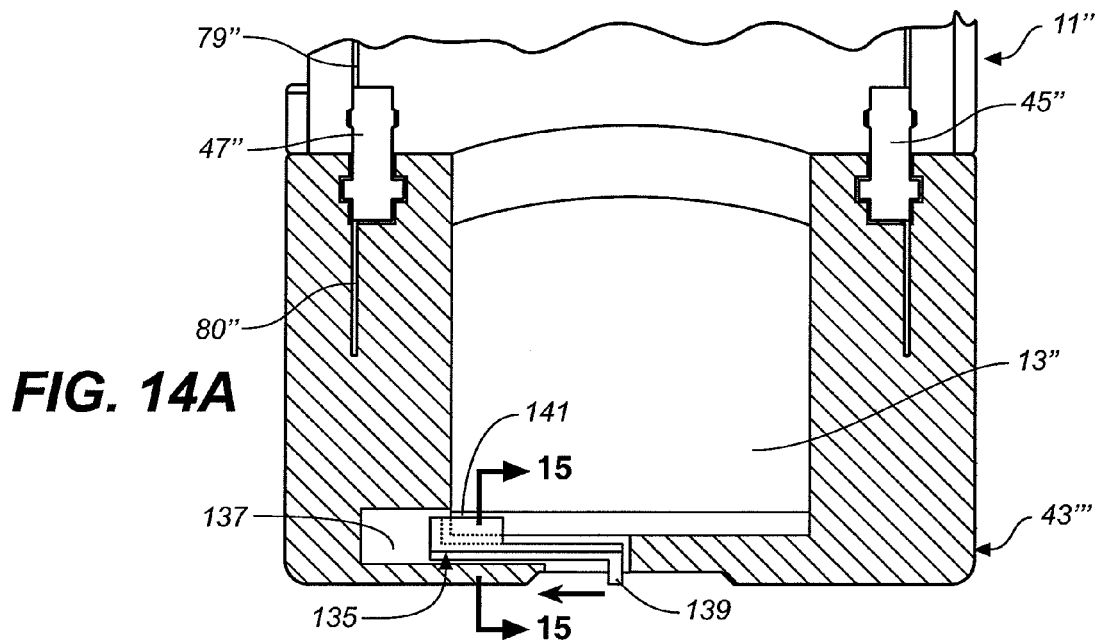
FIGS. 14A and 14B is a plan view of the cover on the card of FIG. 13 with an outer skin removed, its latching mechanism engaged (FIG. 14A) and disengaged (FIG. 14B) with the card body.
Figure 14B:
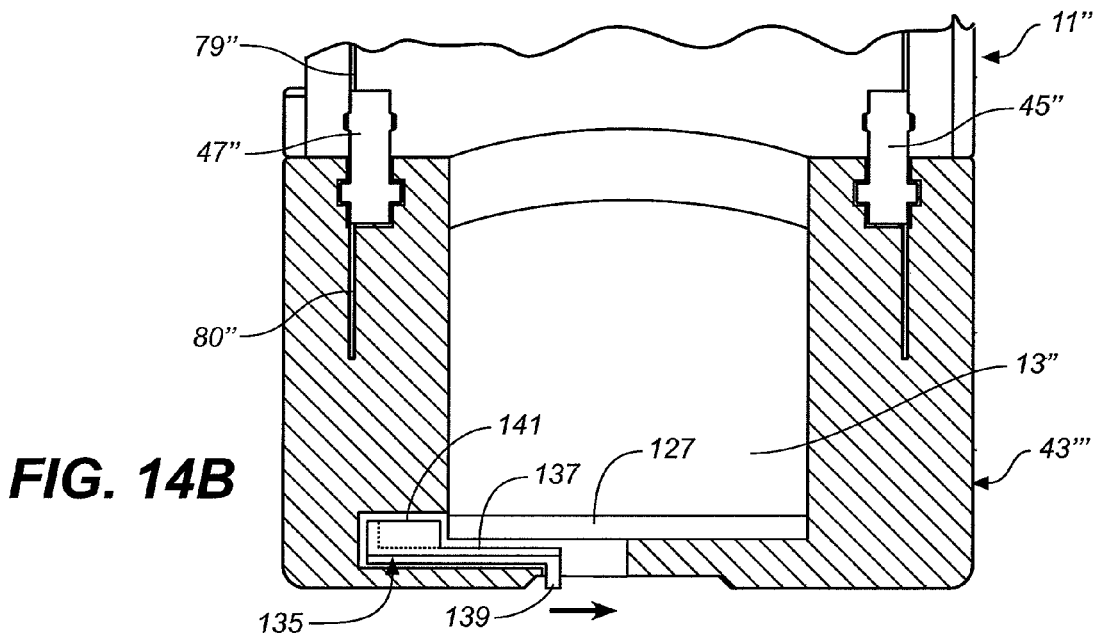
Figure 15:
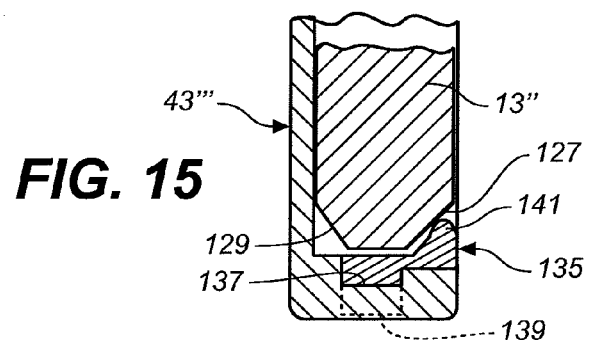
FIG. 15 is a sectional view across section 15-15 of FIG. 14A.

In the second example of FIGS. 13-15, a differently configured cover 43''' has a latching element 135 positioned to slide across the width of the cover within a cavity 137 formed in the cover by moving its lever 139 by hand. The lever 139 extends a short distance out of the end of the cover 43''' so that a finger may move it. A lip 141 is also formed as part of the element 135 to engage the surface 127 of the end of the card extension 13" and hold the cover 43''' closed. In this case, the length of the lip 141 is much shorter than the width of the card extension portion 13". When movement of the lever 139 has caused the element 135 to slide to one extreme position, shown in FIG. 14A, the lip 141 is positioned against the card end surface 127 in a manner that holds the cover closed. The cover lip 141 and card end surface 127 are effectively mating latching elements. When the lever 139 has moved the element 135 into its other extreme position, shown in FIG. 14B, the lip 141 is does not contact the card end but rather is moved to the side away from the card end. When the latching element 135 is in the position shown in FIG. 14B, the cover may be opened or closed.

CONCLUSION

Although the various aspects of the present invention have been described with respect to several exemplary embodiments and variations thereof, it will be understood that the invention is entitled to protection within the full scope of the appended claims.

The invention claimed is:

1. An electronic circuit card, comprising:
an enclosure including electronic circuits therein and having at least one set of electrical contacts on an outside surface thereof that are operably connected with the electronic circuits therein, the set of electrical contacts being positioned in a row extending in a direction across a width of the enclosure with one side of the row being adjacent an end of the card,
a cover rotatably carried by the card about an axis extending across the width of the card on a side of the row of contacts opposite to the end of the card, the cover being rotatable by hand between at least a first position that engages the outside surface of the enclosure to cover the set of contacts and a second position that exposes the set of contacts sufficient for insertion into a mating receptacle, and
a latching mechanism with first and second elements that hold the cover in the first position when engaged, the first element being installed in the cover and the second element being positioned at the end of the card, the first element being resiliently urged within the cover in a direction to engage the second element when the cover is in the first position but which is moveable by hand against the resilient urging to disengage from the second element, thereby to enable rotation of the cover about the axis away from the first position toward the second position.

2. The card of claim 1, wherein the electronic circuits within the card include a mass storage memory in the form of a re-programmable non-volatile flash semiconductor memory connected with the set of electrical contacts to transfer data between the memory and outside of the card through the set of electrical contacts.

3. The card of claim 1, wherein the second element includes a surface formed at the end of the card that is contacted by the first element to latch the cover in its first position.

4. The card of claim 3, wherein the second element surface includes a cut-off corner of the end of the card and the first element includes a protrusion projecting inward of the cover to engage the cut-off corner.

5. The card of claim 1, wherein the first and second elements of the latching mechanism are configured to engage each other by the first element operating against the resilient urging as the cover is rotated into its first position without needing to manipulate the latching mechanism by hand.

6. The card of claim 1, wherein the first element is constrained within the cover to move by hand against the resilient urging in a direction outward of an end of the cover removed from the axis.

7. The card of claim 6, which includes an exposed slot on the first element that is shaped and positioned to receive a fingernail to move the first element against the resilient urging.

8. The card of claim 1, wherein the cover is additionally shaped to cover the end of the card when the cover is in its first position and the first latching element is then moveable by hand away from the card end to disengage the latching mechanism.

9. The card of claim 1, wherein a shape of the end of the card and a number and positions of the contacts within the set of contacts follow a USB card standard.

10. The card of claim 9, wherein the enclosure has a discontinuity is its width, the end of the card and set of contacts being in a portion of the enclosure that is narrower than the enclosure at an opposite end of the card, the cover having a width substantially equal to that of the enclosure at the opposite end of the card.

11. The card of claim 10, which additionally comprises a second set of electrical contacts positioned on the enclosure at the opposite end of the card.

12. The memory card of claim 11, wherein the second set of contacts has a contact pattern and signal protocol therethrough that follows a memory card standard.

13. An electronic circuit card, comprising:
an enclosure including electronic circuits therein and having at least one set of electrical contacts on an outside surface thereof that are operably connected with the electronic circuits therein, the set of electrical contacts being positioned in a row extending in a direction across a width of the enclosure with one side of the row being adjacent an end of the card,
a cover rotatably carried by the card about an axis extending across the width of the card on a side of the row of contacts opposite to the end of the card, the cover being rotatable by hand between at least a first position that engages the outside surface of the enclosure to cover the set of contacts and a second position that exposes the set of contacts sufficient for insertion into a mating receptacle, and a latching mechanism with first and second elements that hold the cover in the first position when engaged, the first element being installed in the cover and the second element being positioned at the end of the card, the first element being exposed from an edge of cover and manually slideable by hand along the cover between first and second positions that respectively latch the cover to the end of the card and release the latch.

14. The card of claim 13, wherein the electronic circuits within the card include a mass storage memory in the form of a re-programmable non-volatile flash semiconductor memory connected with the set of electrical contacts to transfer data between the memory and outside of the card through the set of electrical contacts.

15. The card of claim 13, wherein the second element includes an external surface formed at the end of the card that is engaged by an internal surface of the first element to latch the cover to the end of the card when the first element is slid into a position wherein its internal surface engages the external surface of the end of the card while releasing the latch when the first element is slid to a position wherein its internal surface does not engage the external surface at the end of the card.

16. The card of claim 15, wherein the external surface formed at the end of the card includes the end of the card with a cut-off corner and the internal surface of the first element includes a slot into which the end of the card with a cut-off corner fits.

17. The card of claim 13, wherein the cover is additionally shaped to cover the end of the card when the cover is in its first position and the first latching element is then moveable by hand in a direction substantially parallel to the end of the card to engage and disengage the latching mechanism.

18. The card of claim 13, wherein a shape of the end of the card and a number and positions of the contacts within the set of contacts follow a USB card standard.

19. The card of claim 18, wherein the enclosure has a discontinuity is its width, the end of the card and set of contacts being in a portion of the enclosure that is narrower than the enclosure at an opposite end of the card, the cover having a width substantially equal to that of the enclosure at the opposite end of the card.

20. The card of claim 19, which additionally comprises a second set of electrical contacts positioned on the enclosure at the opposite end of the card.

21. The card of claim 20, wherein the second set of contacts has a contact pattern and signal protocol therethrough that follows a memory card standard.

22. An enclosed electronic circuit card, comprising:
a first portion having a predominately rectangular shape and a first set of contacts positioned at one end of the card and accessible from an outside surface thereof,
a second portion rigidly connected to the first portion and having a predominately rectangular shape with a width less than that of the first portion, a second set of contacts positioned on an outside surface thereof at an end of the card opposite said one end,
a cover hinged to the memory card adjacent the connection of the first and second portions in a manner to be rotatable by hand about an axis extending across the width of the card between a first position that engages the outside surface of the second portion and covers the second set of contacts and a second position that exposes the second set of contacts, the cover having a width substantially equal to that of the first portion of the card, and
a manually actuatable latch within the cover that holds the cover in the first position against rotation about the axis when a first element thereof engages a mating second element on an end of the second portion of the memory card, the first element being slideable within the cover by hand out of a position mating with the second element to allow rotation of the cover by hand in a direction toward the second position of the cover.

23. The card of claim 22, wherein the first element of the latch is slideable outward of an end of the cover against the force of a spring in the cover.

24. The card of claim 22, wherein the first element of the latch is slideable in a direction substantially parallel with the end of the second portion of the memory card.

25. The card of claim 22, wherein the external shape and dimensions of the circuit card when the cover is in its first position follows the SD memory card standard.

* * * * *